US012564107B2

(12) United States Patent
Li et al.

(10) Patent No.: US 12,564,107 B2
(45) Date of Patent: Feb. 24, 2026

(54) PACKAGE COMPRISING OPTICAL INTEGRATED DEVICE

(71) Applicant: QUALCOMM Incorporated, San Diego, CA (US)

(72) Inventors: Xia Li, San Diego, CA (US); Aniket Patil, San Diego, CA (US); Dongming He, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 285 days.

(21) Appl. No.: 18/340,733

(22) Filed: Jun. 23, 2023

(65) Prior Publication Data

US 2024/0321849 A1 Sep. 26, 2024

(51) Int. Cl.
| | |
|---|---|
| *H01L 25/16* | (2023.01) |
| *G02B 6/42* | (2006.01) |
| *H01L 23/00* | (2006.01) |
| *H01L 23/31* | (2006.01) |
| *H01L 23/498* | (2006.01) |
| *H01L 23/538* | (2006.01) |
| *H10B 80/00* | (2023.01) |

(52) U.S. Cl.
CPC .......... *H01L 25/167* (2013.01); *G02B 6/4251* (2013.01); *H01L 23/3128* (2013.01); *H01L 23/49811* (2013.01); *H01L 23/5385* (2013.01); *H01L 24/16* (2013.01); *H10B 80/00* (2023.02); *H01L 2224/16227* (2013.01)

(58) Field of Classification Search
CPC .............................. G02B 6/4251; H10B 80/00
See application file for complete search history.

(56) References Cited

U.S. PATENT DOCUMENTS

| | | |
|---|---|---|
| 2021/0091056 A1 | 3/2021 | Yu et al. |
| 2022/0342150 A1 | 10/2022 | Karhade et al. |
| 2023/0082706 A1* | 3/2023 | Ganesan ............. H01L 23/5385 |
| | | 257/734 |
| 2023/0089877 A1* | 3/2023 | Karhade .............. G02B 6/4214 |
| | | 385/33 |
| 2024/0319455 A1 | 9/2024 | Li et al. |

OTHER PUBLICATIONS

International Search Report and Written Opinion—PCT/US2024/034751—ISA/EPO—Oct. 22, 2024.

* cited by examiner

*Primary Examiner* — Sung H Pak
(74) *Attorney, Agent, or Firm* — Loza & Loza, LLP

(57) ABSTRACT

A package comprising a package substrate; a first integrated device coupled to the package substrate through a first plurality of solder interconnects; an encapsulation layer at least partially encapsulating the first integrated device; a plurality of post interconnects at least partially located in the encapsulation layer; a metallization portion coupled to the plurality of post interconnects; a second integrated device coupled to the metallization portion through a second plurality of solder interconnects; an optical integrated device coupled to the package substrate; and an optical fiber coupled to the optical integrated device.

20 Claims, 23 Drawing Sheets

*CROSS SECTIONAL SIDE PROFILE VIEW*

CROSS SECTIONAL SIDE PROFILE VIEW

CROSS SECTIONAL SIDE PROFILE VIEW

CROSS SECTIONAL SIDE PROFILE VIEW

CROSS SECTIONAL SIDE PROFILE VIEW

CROSS SECTIONAL SIDE PROFILE VIEW

CROSS SECTIONAL SIDE PROFILE VIEW

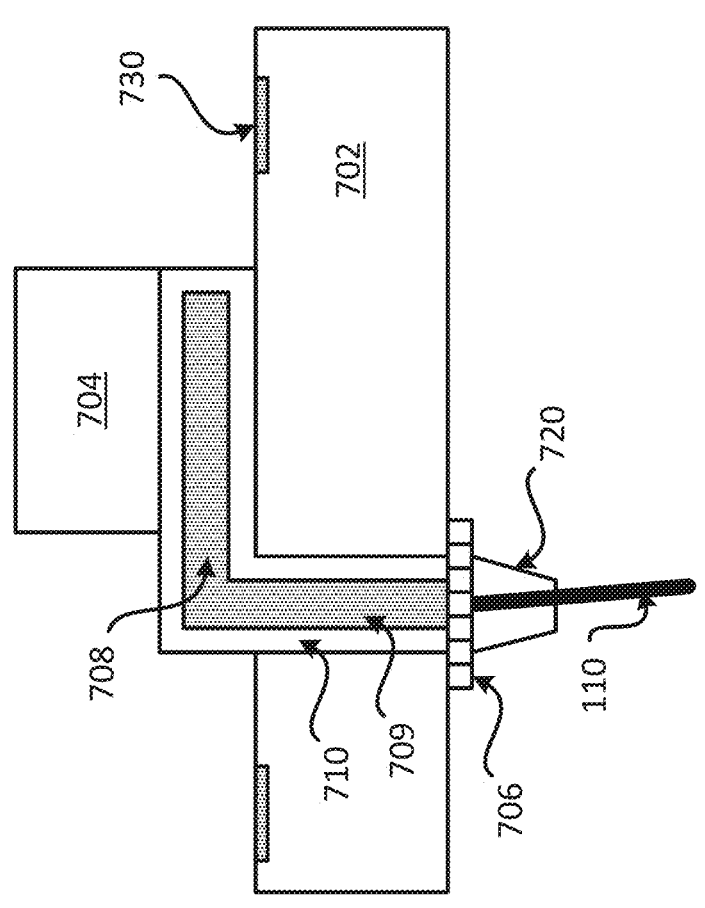
CROSS SECTIONAL SIDE PROFILE VIEW
FIG. 7

110

720

706

702

704

830

840

800

CROSS SECTIONAL SIDE PROFILE VIEW

CROSS SECTIONAL SIDE PROFILE VIEW

CROSS SECTIONAL SIDE PROFILE VIEW

CROSS SECTIONAL SIDE PROFILE VIEW

CROSS SECTIONAL SIDE PROFILE VIEW

CROSS SECTIONAL SIDE PROFILE VIEW

CROSS SECTIONAL SIDE PROFILE VIEW

CROSS SECTIONAL SIDE PROFILE VIEW

CROSS SECTIONAL SIDE PROFILE VIEW

BOARD COUPLING

OPTICAL INTEGRATED
DEVICE COUPLING

1800

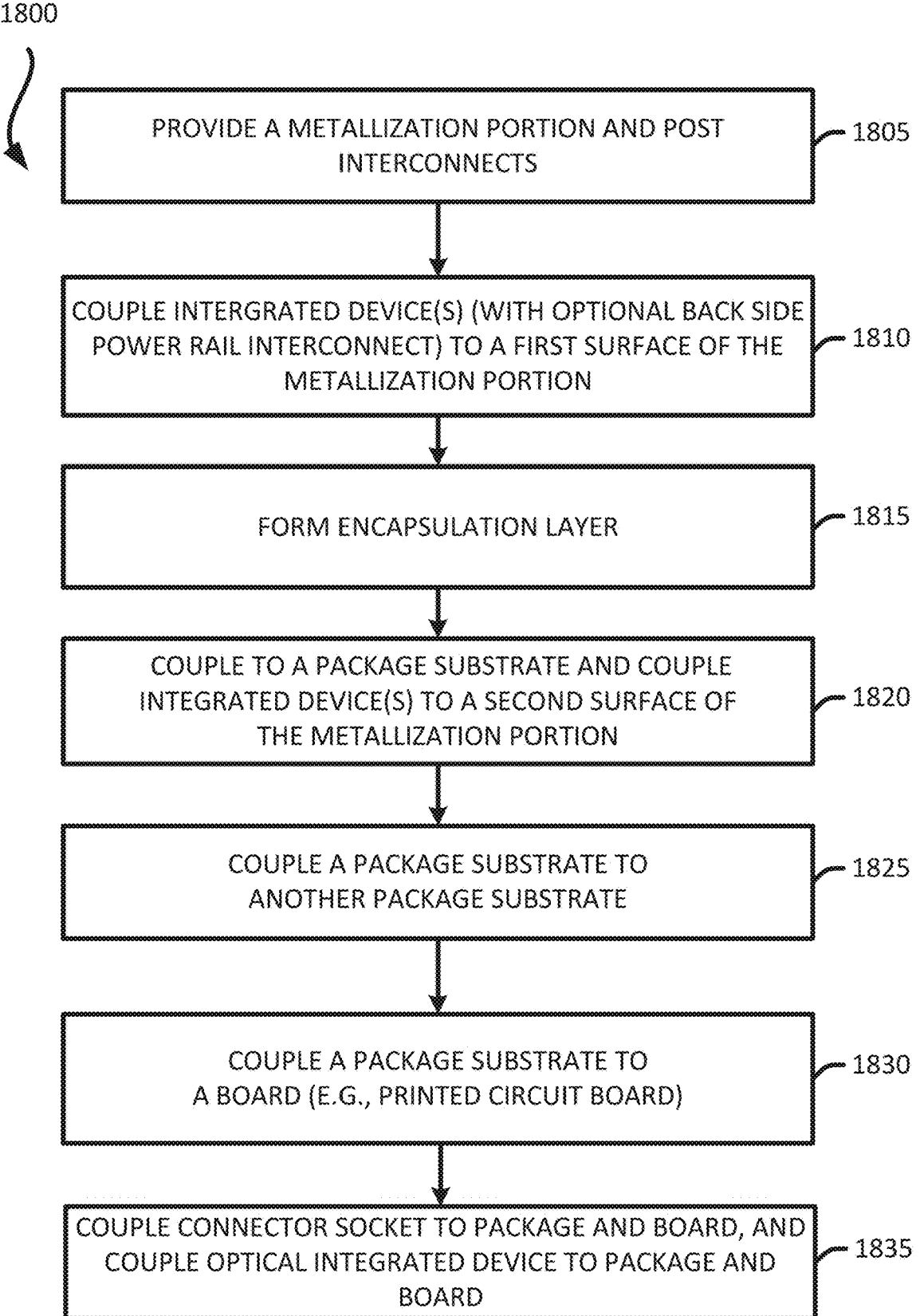

PROVIDE A METALLIZATION PORTION AND POST INTERCONNECTS — 1805

COUPLE INTERGRATED DEVICE(S) (WITH OPTIONAL BACK SIDE POWER RAIL INTERCONNECT) TO A FIRST SURFACE OF THE METALLIZATION PORTION — 1810

FORM ENCAPSULATION LAYER — 1815

COUPLE TO A PACKAGE SUBSTRATE AND COUPLE INTEGRATED DEVICE(S) TO A SECOND SURFACE OF THE METALLIZATION PORTION — 1820

COUPLE A PACKAGE SUBSTRATE TO ANOTHER PACKAGE SUBSTRATE — 1825

COUPLE A PACKAGE SUBSTRATE TO A BOARD (E.G., PRINTED CIRCUIT BOARD) — 1830

COUPLE CONNECTOR SOCKET TO PACKAGE AND BOARD, AND COUPLE OPTICAL INTEGRATED DEVICE TO PACKAGE AND BOARD — 1835

*FIG. 18*

PACKAGE COMPRISING OPTICAL INTEGRATED DEVICE

FIELD

Various features relate to a package that includes an integrated device.

BACKGROUND

A package may include a substrate and integrated devices. These components are coupled together to provide a package that may perform various functions. The performance of a package and its components may depend on many factors. There is an ongoing need to provide packages that provide improved performances. Moreover, there is an ongoing need to include a package that includes a more compact form factor so that the package may be implemented in smaller devices.

SUMMARY

Various features relate to a package that includes an integrated device.

One example provides a package comprising a first package substrate; a second package substrate coupled to the first package substrate through a first plurality of solder interconnects; a first integrated device coupled to the second package substrate through a second plurality of solder interconnects; an encapsulation layer at least partially encapsulating the first integrated device; a plurality of post interconnects located in the encapsulation layer; a metallization portion coupled to the plurality of post interconnects; a second integrated device coupled to the metallization portion through a third plurality of solder interconnects; an optical integrated device coupled to the first package substrate; and an optical fiber coupled to the optical integrated device.

Another example provides a package comprising a first package substrate; an intermediate portion coupled to the first package substrate through a first plurality of solder interconnects, wherein the intermediate portion includes a first integrated device and a first encapsulation layer; a second integrated device coupled to the intermediate portion through a second plurality of solder interconnects; a second encapsulation layer at least partially encapsulating the first integrated device; a plurality of post interconnects located in the encapsulation layer; a metallization portion coupled to the plurality of post interconnects; a third integrated device coupled to the metallization portion through a third plurality of solder interconnects; an optical integrated device coupled to the first package substrate; and an optical fiber coupled to the optical integrated device.

BRIEF DESCRIPTION OF THE DRAWINGS

Various features, nature and advantages may become apparent from the detailed description set forth below when taken in conjunction with the drawings in which like reference characters identify correspondingly throughout.

FIG. 7 illustrates a cross sectional profile view of an exemplary optical integrated device.

FIG. 18 illustrates an exemplary flow diagram of a method for fabricating a package comprising an optical integrated device.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package comprising a first package substrate; a second package substrate coupled to the first package substrate through a first plurality of solder interconnects; a first integrated device coupled to the second package substrate through a second plurality of solder interconnects; an encapsulation layer at least partially encapsulating the first integrated device; a plurality of post interconnects located in the encapsulation layer; a metallization portion coupled to the plurality of post interconnects; a second integrated device coupled to the metallization portion through a third plurality of solder interconnects; an optical integrated device coupled to the first package substrate; and an optical fiber coupled to the optical integrated device. The optical integrated device coupled to the package substrate provides a short distance for at least one electrical path to various integrated devices of the package. Moreover, the optical integrated device being closer to the integrated devices provides a small IR drop, which helps improve the performance of the integrated devices and/or the package.

Exemplary Package Comprising an Optical Integrated Device

Figure 1:
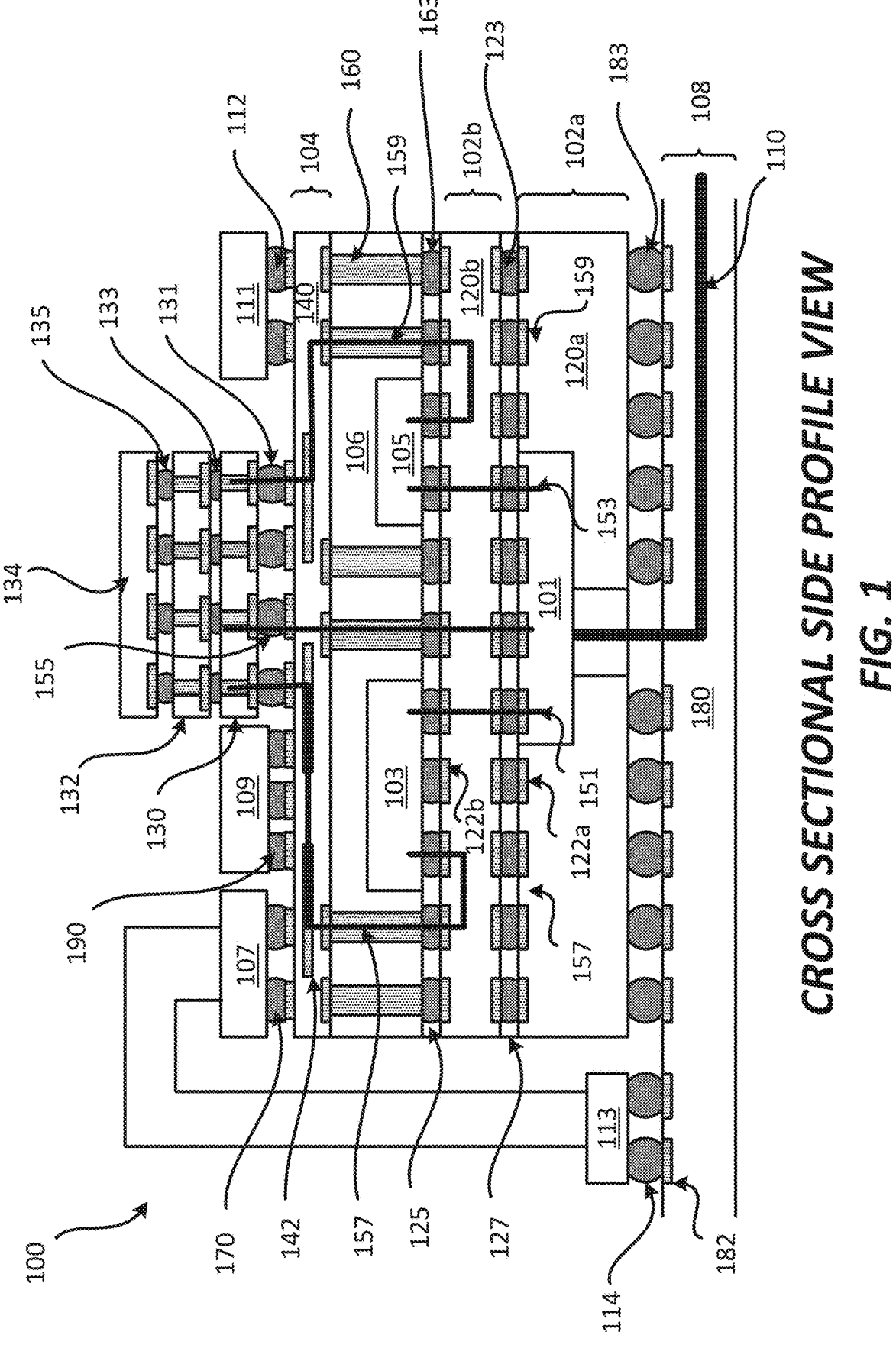
FIG. 1 illustrates a cross sectional profile view of an exemplary package comprising an optical integrated device.

FIG. 1 illustrates a cross sectional profile view of a package 100 that includes an optical integrated device. The package 100 includes an optical integrated device 101, a package substrate 102a, a package substrate 102b, an integrated device 103, a metallization portion 104, an integrated device 105, an integrated device 109, a connector socket 107, a passive device 111, an integrated device 130, an integrated device 132, an integrated device 134, a plurality of post interconnects 160 and an encapsulation layer 106. It is noted that the package substrate 102b may be implemented as an interposer that includes through silicon vias (TSVs). The interposer may include a silicon substrate with vias that extend vertically through the silicon substrate.

The package substrate 102a includes at least one dielectric layer 120a and a plurality of interconnects 122a (e.g., substrate interconnects). The optical integrated device 101 is coupled to the package substrate 102a. For example, the optical integrated device 101 may be embedded in the package substrate 102a. In some implementations, the optical integrated device 101 may be located in a cavity of the package substrate 102a. The package substrate 102a may be a first package substrate. The optical integrated device 101 may be coupled to the package substrate 102a through an adhesive (not shown). An optical fiber 110 is coupled to the optical integrated device 101. The optical fiber 110 may be considered part of the package 100. The optical fiber 110 may be coupled to another optical integrated device (not shown). The other optical integrated device may be coupled to another package or a board. An example of an optical integrated device 101 is illustrated and described below in at FIG. 7. An optical integrated device may include the ability (i) to convert optical signal/energy into electrical signal/energy and/or (ii) to convert electrical signal/energy into optical signal/energy. For example, a signal may be received as an optical signal and may be converted to an electrical signal. Similarly, a signal may be received as an electrical signal and may be converted to an optical signal. An optical integrated device may send a signal as an optical signal and/or an electrical signal.

The package substrate 102b includes at least one dielectric layer 120b and a plurality of interconnects 122b (e.g., substrate interconnects). The package substrate 102b may be a second packages substrate. The package substrate 102b is coupled to the package substrate 102a through a plurality of solder interconnects 123. The plurality of solder interconnects 123 may be coupled to the plurality of interconnects 122a and the plurality of interconnects 122b. The package substrate 102b may also be coupled to the optical integrated device 101 through the plurality of solder interconnects 123. There is an underfill 127 between the package substrate 102a and the package substrate 102b. The underfill 127 may laterally surround the plurality of solder interconnects 123.

The encapsulation layer 106 may at least partially encapsulate the integrated device 103, the integrated device 105 and the plurality of post interconnects 160. The integrated device 103 is coupled to the package substrate 102b through solder interconnects from the plurality of solder interconnects 163. A front side of the integrated device 103 is facing the package substrate 102b. The integrated device 105 is coupled to the package substrate 102b through other solder interconnects from the plurality of solder interconnects 163. A front side of the integrated device 105 is facing the package substrate 102b. The plurality of post interconnects 160 are coupled to the package substrate 102b through other solder interconnects from the plurality of solder interconnects 163. There is an underfill 125 between the package substrate 102b and the encapsulation layer 106. The underfill 125 may laterally surround the plurality of solder interconnects 163. The underfill 125 may be coupled to and touching the package substrate 102b, the plurality of solder interconnects 123, the encapsulation layer 106, the integrated device 103 and the integrated device 105.

The metallization portion 104 is coupled to the encapsulation layer 106 and the plurality of post interconnects 160. The metallization portion 104 includes at least one dielectric layer 140 and a plurality of metallization interconnects 142. The metallization portion 104 may be a redistribution portion. The plurality of metallization interconnects 142 may include redistribution interconnects. The plurality of post interconnects 160 are coupled to metallization interconnects from the plurality of metallization interconnects 142 of the metallization portion 104. A back side of the integrated device 103 may face the metallization portion 104. A back side of the integrated device 105 may face the metallization portion 104. A bottom surface of the metallization portion 104 may be coupled to the encapsulation layer 106.

The passive device 111 may be coupled to a top surface of the metallization portion 104, through a plurality of solder interconnects 112. For example, the passive device 111 may be coupled to metallization interconnects from the plurality of metallization interconnects 142 through the plurality of solder interconnects 112.

The integrated device 109 may be coupled to a top surface of the metallization portion 104, through a plurality of solder interconnects 190. For example, the integrated device 109 may be coupled to metallization interconnects from the plurality of metallization interconnects 142 through the plurality of solder interconnects 190. The integrated device 130 may be coupled to a top surface of the metallization portion 104, through a plurality of solder interconnects 131. For example, the integrated device 130 may be coupled to metallization interconnects from the plurality of metallization interconnects 142 through the plurality of solder interconnects 131.

The integrated device 132 is coupled to the integrated device 130 through a plurality of solder interconnects 133. The integrated device 134 is coupled to the integrated device 132 through a plurality of solder interconnects 135. The integrated device 130, the integrated device 132 and the integrated device 134 may be stacked integrated devices.

The connector socket 107 is coupled to the top surface of the metallization portion 104 through a plurality of solder interconnects 170. The connector socket 107 is configured to be electrically coupled to the connector socket 113. The connector socket 107 is configured to provide an electrical path for power. The connector socket 107 is configured to provide an electrical path for ground. The connector socket 107 may be coupled to the connector socket 113 through one or more wiring.

The package 100 is coupled to a board 108 through a plurality of solder interconnects 183. The board 108 includes at least one board dielectric layer 180 and a plurality of board interconnects 182. The connector socket 113 is coupled to the board 108 through a plurality of solder interconnects 114.

The optical fiber 110 is coupled to the optical integrated device 101. The optical fiber 110 may extend through the package substrate 102a. The optical fiber 110 may extend through a cavity in the package substrate 102a. In some implementations, the optical fiber 110 may extend in the board 108. In some implementations, the optical fiber 110 may extend between the package substrate 102a and the board 108. One or more optical signals may travel to and/or from the optical integrated device 101 through the optical fiber 110.

The integrated device 103 may be configured to be electrically coupled to the optical integrated device 101 through an electrical path 151 that includes a solder interconnect from the plurality of solder interconnects 163, the package substrate 102b and a solder interconnect from the plurality of solder interconnects 123. The integrated device 105 may be configured to be electrically coupled to the optical integrated device 101 through an electrical path 153 that includes a solder interconnect from the plurality of solder interconnects 163, the package substrate 102b and a solder interconnect from the plurality of solder interconnects 123. The integrated device 103 may be configured to be electrically coupled to the optical integrated device 101 through an electrical path that includes a solder interconnect from the plurality of solder interconnects 163, the package substrate 102b and another solder interconnects from the plurality of solder interconnects 163. In some implementations, the integrated device 103 may be configured to be electrically coupled to the optical integrated device 101 through an electrical path that includes a solder interconnect from the plurality of solder interconnects 163, the package substrate 102b, a solder interconnects from the plurality of solder interconnects 123, the optical integrated device 101 and another solder interconnect from the plurality of solder interconnects 123, the package substrate 102b and another solder interconnect from the plurality of solder interconnects 163. The integrated device 130 may be configured to be electrically coupled to the optical integrated device 101 through an electrical path 155 that includes a solder interconnect from the plurality of solder interconnects 131, metallization interconnects from the metallization portion 104, a post interconnect from the plurality of post interconnects 160, a solder interconnect from the plurality of solder interconnects 163, the package substrate 102b, and a solder interconnect from the plurality of solder interconnects 123. The electrical path 155 may include an electrical path between the integrated device 130 and the integrated device 134. The electrical path between the integrated device 130 and the integrated device 134 may include a die interconnect from the integrated device 130, a through substrate via from the integrated device 130, a solder interconnect from the plurality of solder interconnects 133, a die interconnect from the integrated device 132, a through substrate via from the integrated device 132, a solder interconnect from the plurality of solder interconnects 135, and a die interconnect from the integrated device 134. In some implementations, there may be pillar interconnects between (i) the integrated device 130 and the integrated device 132 and/or (ii) the integrated device 132 and the integrated device 134. In such instances, the electrical path between the integrated device 130 and the integrated device 134 may also include the above mentioned pillar interconnects.

The integrated device 130 may be configured to be electrically coupled to the integrated device 103 through an electrical path 157 that includes a solder interconnect from the plurality of solder interconnects 131, metallization interconnects from the metallization portion 104, a post interconnect from the plurality of post interconnects 160, a solder interconnect from the plurality of solder interconnects 163, interconnects from the package substrate 102b, and another solder interconnect from the plurality of solder interconnects 163. The electrical path 157 may include an electrical path between the integrated device 130 and the integrated device 134. The electrical path between the integrated device 130 and the integrated device 134 may include a die interconnect from the integrated device 130, a through substrate via from the integrated device 130, a solder interconnect from the plurality of solder interconnects 133, a die interconnect from the integrated device 132, a through substrate via from the integrated device 132, a solder interconnect from the plurality of solder interconnects 135, and a die interconnect from the integrated device 134. In some implementations, there may be pillar interconnects between (i) the integrated device 130 and the integrated device 132 and/or (ii) the integrated device 132 and the integrated device 134. In such instances, the electrical path between the integrated device 130 and the integrated device 134 may also include the above mentioned pillar interconnects.

The integrated device 130 may be configured to be electrically coupled to the integrated device 105 through an electrical path 159 that includes a solder interconnect from the plurality of solder interconnects 131, metallization interconnects from the metallization portion 104, a post interconnect from the plurality of post interconnects 160, a solder interconnect from the plurality of solder interconnects 163, interconnects from the package substrate 102b, and another solder interconnect from the plurality of solder interconnects 163. The electrical path 159 may include an electrical path between the integrated device 130 and the integrated device 134. The electrical path between the integrated device 130 and the integrated device 134 may include a die interconnect from the integrated device 130, a through substrate via from the integrated device 130, a solder interconnect from the plurality of solder interconnects 133, a die interconnect from the integrated device 132, a through substrate via from the integrated device 132, a solder interconnect from the plurality of solder interconnects 135, and a die interconnect from the integrated device 134. In some implementations, there may be pillar interconnects between (i) the integrated device 130 and the integrated device 132 and/or (ii) the integrated device 132 and the integrated device 134. In such instances, the electrical path between the integrated device 130 and the integrated device 134 may also include the above mentioned pillar interconnects.

In some implementations, an optical signal may be received by the optical integrated device 101 through the optical fiber 110. The optical signal may be converted into an electrical signal by the optical integrated device 101 and the electrical signal may be sent to the integrated device 103, the integrated device 105 and/or the integrated device 130, using one or more of the electrical paths described above.

In some implementations, an electrical signal may be received by the optical integrated device 101 through one or more of the electrical paths described above. The electrical signal may be converted into an optical signal by the optical integrated device 101, and the optical signal may be sent through the optical fiber 110.

The integrated device 103 may be a system on chip (SoC). The integrated device 103 may be a system on chip (SoC). The integrated device 109 may include a power management integrated circuit (PMIC). The passive device 111 may include a capacitor. The integrated device 130, the integrated device 132 and/or the integrated device 134 may include memory. An electrical path between the integrated device 109 and the integrated device 130, may include a solder interconnect from the plurality of solder interconnects 190, metallization interconnects from the plurality of metallization interconnects 142 and a solder interconnect from the plurality of solder interconnects 131. An electrical path between the integrated device 109 and the integrated device

134, may include the electrical path between the integrated device 130 and the integrated device 134, as described above.

In some implementations, the optical integrated device 101 may be configured to operate as a bridge. The integrated device 103 may be configured to be electrically coupled to the integrated device 105 through the optical integrated device 101. For example, an electrical path between the integrated device 103 and the integrated device 105 may include the optical integrated device 101. An electrical path between the integrated device 103 and the integrated device 105 may include the electrical path 151 (as described above), interconnects from the optical integrated device 101 and the electrical path 153 (as described above).

Figure 2:
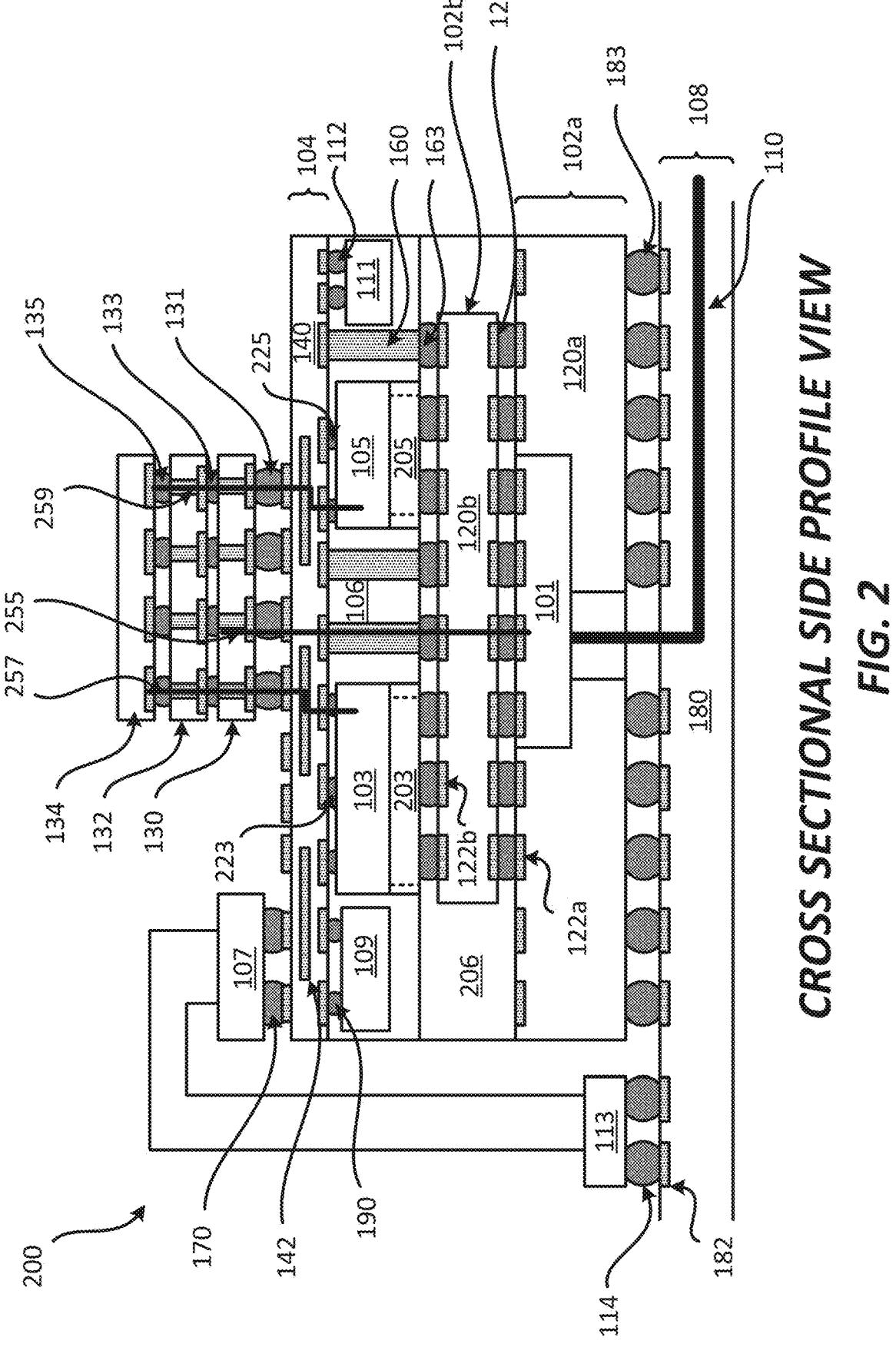
FIG. 2 illustrates a cross sectional profile view of an exemplary package comprising an optical integrated device.

FIG. 2 illustrates a cross sectional profile view of a package 200 that includes an optical integrated device. The package 200 includes an optical integrated device 101, a package substrate 102*a*, a package substrate 102*b*, an integrated device 103, a metallization portion 104, an integrated device 105, an integrated device 109, a connector socket 107, a passive device 111, an integrated device 130, an integrated device 132, an integrated device 134, a plurality of post interconnects 160, an encapsulation layer 106, an encapsulation layer 206, at least one back side power rail interconnect 203, and at least one back side power rail interconnect 205. It is noted that the package substrate 102*b* may be implemented as an interposer that includes through silicon vias (TSVs). The interposer may include a silicon substrate with vias that extend vertically through the silicon substrate. The interposer may also includes surface pads and/or surface traces, on a first surface and/or a second surface of the interposer.

The at least one back side power rail interconnect 203 may be considered part of the integrated device 103. For example, the at least one back side power rail interconnect 203 may be located in a die substrate of the integrated device 103. The back side power rail interconnect 203 may include trace interconnects and/or through substrate vias. The back side power rail interconnect 203 may considered part of the back side of the integrated device 103. The at least one back side power rail interconnect 205 may be considered part of the integrated device 105. For example, the at least one back side power rail interconnect 205 may be located in a die substrate of the integrated device 105. The back side power rail interconnect 205 may include trace interconnects and/or through substrate vias. The back side power rail interconnect 205 may considered part of the back side of the integrated device 105.

The package 200 is similar to the package 100. However, some of the components of the package 200 are located and/or coupled differently than some of the components in the package 100.

The integrated device 103 is coupled to a bottom surface of the metallization portion 104 through a plurality of solder interconnects 223. A front side of the integrated device 103 may face the metallization portion 104. The integrated device 105 is coupled to a bottom surface of the metallization portion 104 through a plurality of solder interconnects 225. A front side of the integrated device 105 may face the metallization portion 104. The integrated device 109 is coupled to a bottom surface of the metallization portion 104 through a plurality of solder interconnects 190. The passive device 111 is coupled to a bottom surface of the metallization portion 104 through a plurality of solder interconnects 112. The encapsulation layer 106 may at least partially encapsulate the integrated device 103, the integrated device 105, the integrated device 109, the passive device 111, the back side power rail interconnect 203, the back side power rail interconnect 205 and the plurality of post interconnects 160. The encapsulation layer 106 may include a mold, a resin and/or an epoxy. A compression molding process, a transfer molding process, or a liquid molding process may be used to form the encapsulation layer 106.

The package substrate 102*b* is coupled to the package substrate 102*a* through a plurality of solder interconnects 123. The integrated device 103 is coupled to the package substrate 102*b* through a plurality of solder interconnects 163. The integrated device 105 is coupled to the package substrate 102*b* through a plurality of solder interconnects 163.

The package 200 is coupled to the board 108 through a plurality of solder interconnects 183. The connector socket 113 is coupled to the board 108 through a plurality of solder interconnects 114.

The integrated device 130 may be configured to be electrically coupled to the integrated device 103 through an electrical path 257 that includes a solder interconnect from the plurality of solder interconnects 131, metallization interconnects from the metallization portion 104, and a solder interconnect from the plurality of solder interconnects 223. The integrated device 130 may be configured to be electrically coupled to the integrated device 105 through an electrical path 259 that includes a solder interconnect from the plurality of solder interconnects 131, metallization interconnects from the metallization portion 104, and a solder interconnect from the plurality of solder interconnects 225. The electrical path 257 may include an electrical path between the integrated device 130 and the integrated device 134. The electrical path between the integrated device 130 and the integrated device 134 may include a die interconnect from the integrated device 130, a through substrate via from the integrated device 130, a solder interconnect from the plurality of solder interconnects 133, a die interconnect from the integrated device 132, a through substrate via from the integrated device 132, a solder interconnect from the plurality of solder interconnects 135, and a die interconnect from the integrated device 134. In some implementations, there may be pillar interconnects between (i) the integrated device 130 and the integrated device 132 and/or (ii) the integrated device 132 and the integrated device 134. In such instances, the electrical path between the integrated device 130 and the integrated device 134 may also include the above mentioned pillar interconnects. The electrical path 259 may include an electrical path between the integrated device 130 and the integrated device 134. The electrical path between the integrated device 130 and the integrated device 134 may include a die interconnect from the integrated device 130, a through substrate via from the integrated device 130, a solder interconnect from the plurality of solder interconnects 133, a die interconnect from the integrated device 132, a through substrate via from the integrated device 132, a solder interconnect from the plurality of solder interconnects 135, and a die interconnect from the integrated device 134. In some implementations, there may be pillar interconnects between (i) the integrated device 130 and the integrated device 132 and/or (ii) the integrated device 132 and the integrated device 134. In such instances, the electrical path between the integrated device 130 and the integrated device 134 may also include the above mentioned pillar interconnects.

The integrated device 130 may be configured to be electrically coupled to the optical integrated device 101 through an electrical path 255 that includes a solder interconnect from the plurality of solder interconnects 131, metallization interconnects from the metallization portion 104, a post interconnect from the plurality of post interconnects 160, a solder interconnect from the plurality of solder interconnects 163, the package substrate 102b, and a solder interconnect from the plurality of solder interconnects 123. The electrical path 255 may include an electrical path between the integrated device 130 and the integrated device 134. The electrical path between the integrated device 130 and the integrated device 134 may include a die interconnect from the integrated device 130, a through substrate via from the integrated device 130, a solder interconnect from the plurality of solder interconnects 133, a die interconnect from the integrated device 132, a through substrate via from the integrated device 132, a solder interconnect from the plurality of solder interconnects 135, and a die interconnect from the integrated device 134. In some implementations, there may be pillar interconnects between (i) the integrated device 130 and the integrated device 132 and/or (ii) the integrated device 132 and the integrated device 134. In such instances, the electrical path between the integrated device 130 and the integrated device 134 may also include the above mentioned pillar interconnects.

In some implementations, the integrated device 103 may be configured to be electrically coupled to the integrated device 105 through the plurality of solder interconnects 223, metallization interconnects from the plurality of metallization interconnects 142 and the plurality of solder interconnects 225.

In some implementations, the integrated device 103 may be configured to be electrically coupled to the integrated device 105 through solder interconnects from the plurality of solder interconnects 163, the package substrate 102b and other solder interconnects from the plurality of solder interconnects 163. In some implementations, the optical integrated device 101, the integrated device 103 and/or the integrated device 105 may be one or more chiplets. In some implementations, the integrated device 103 may be fabricated using a first technology node, the integrated device 105 may be fabricated using a second technology node that is not as advanced as the first technology node. The optical integrated device 101 may be fabricated using a third technology node that is different from the first technology node and/or the second technology node.

In some implementations, an optical signal may be received by the optical integrated device 101 through the optical fiber 110. The optical signal may be converted into an electrical signal by the optical integrated device 101 and the electrical signal may be sent to the integrated device 103, the integrated device 105 and/or the integrated device 130, using one or more of the electrical paths described above.

In some implementations, an electrical signal may be received by the optical integrated device 101 through one or more of the electrical paths described above. The electrical signal may be converted into an optical signal by the optical integrated device 101, and the optical signal may be sent through the optical fiber 110.

The optical integrated device 101 is coupled to the package substrate 102a. For example, the optical integrated device 101 may be embedded in the package substrate 102a. In some implementations, the optical integrated device 101 may be located in a cavity of the package substrate 102a. The optical integrated device 101 may be coupled to the package substrate 102a through at least one bump interconnect and/or at least one solder interconnect. An optical fiber 110 is coupled to the optical integrated device 101. The optical fiber 110 may be considered part of the package 200.

Power may be provided to the integrated device 103 through a back side of the integrated device 103. For example, an electrical path for power to the integrated device 103 may include interconnects from the plurality of interconnects 122b, at least one solder interconnect from the plurality of solder interconnects 123 and the at least one back side power rail interconnect 203. Similarly, power may be provided to the integrated device 105 through a back side of the integrated device 105. For example, an electrical path for power to the integrated device 105 may include interconnects from the plurality of interconnects 122a, at least one solder interconnect from the plurality of solder interconnects 123 and the at least one back side power rail interconnect 205.

Figure 3:
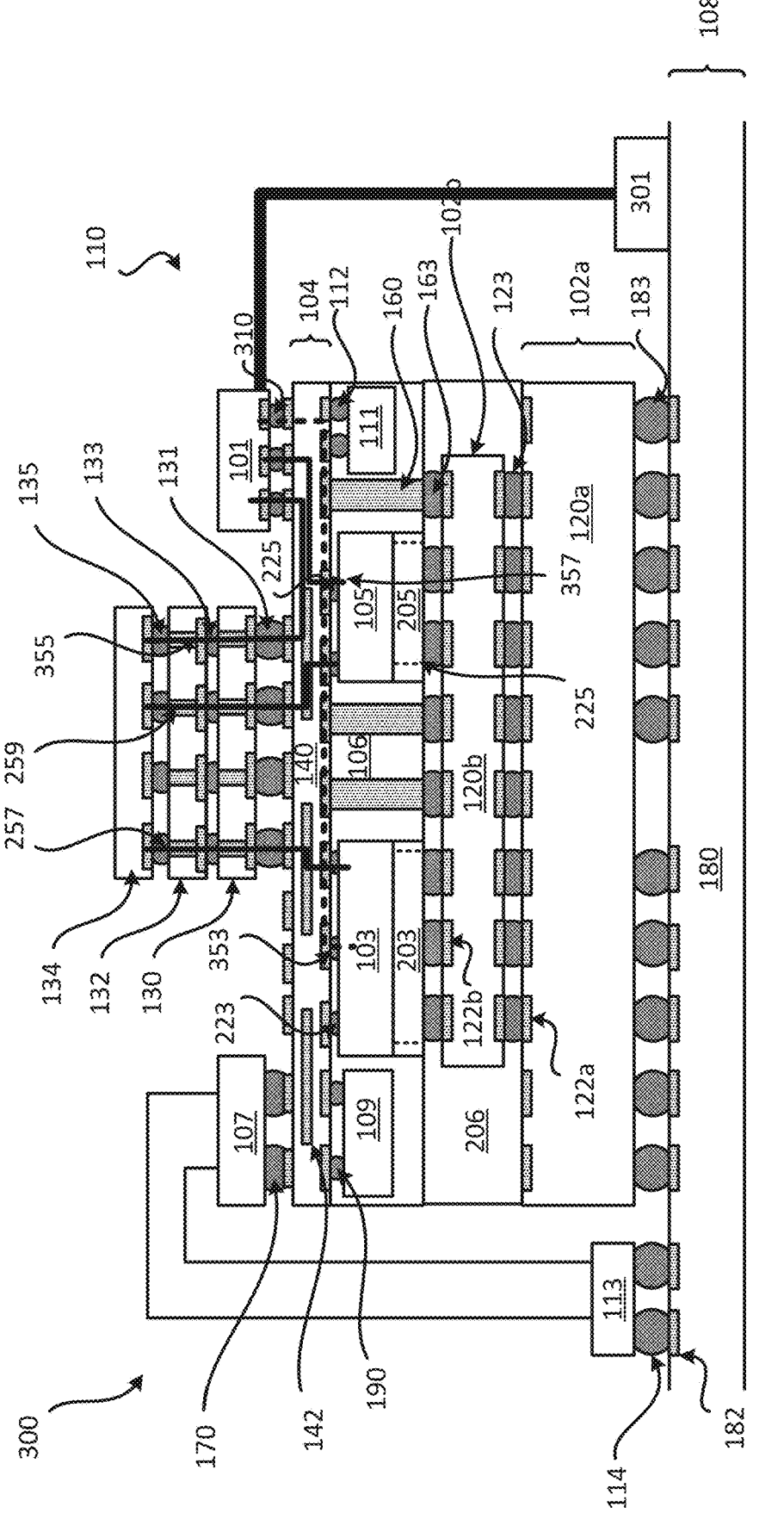
FIG. 3 illustrates a cross sectional profile view of an exemplary package comprising an optical integrated device.

FIG. 3 illustrates a cross sectional profile view of a package 300 that includes an optical integrated device. The package 300 includes an optical integrated device 101, a package substrate 102a, an integrated device 103, a metallization portion 104, an integrated device 105, an integrated device 109, a connector socket 107, a passive device 111, an integrated device 130, an integrated device 132, an integrated device 134, a plurality of post interconnects 160, an encapsulation layer 106, at least one back side power rail interconnect 203, and at least one back side power rail interconnect 205.

The package 300 is similar to the package 200. However, some of the components of the package 300 are located and/or coupled differently than some of the components in the package 200.

For example, the optical integrated device 101 is coupled to a top surface of the metallization portion 104 through a plurality of solder interconnects 310. An example of an optical integrated device 101 is illustrated and described below in at FIG. 8. The optical integrated device 101 is coupled to an optical integrated device 301 through the optical fiber 110. The optical integrated device 301 is coupled to the board 108. The optical integrated device 301 may be coupled to the board 108 through a plurality of solder interconnects.

The integrated device 130 may be configured to be electrically coupled to the integrated device 103 through an electrical path 257 that includes a solder interconnect from the plurality of solder interconnects 131, metallization interconnects from the metallization portion 104, and a solder interconnect from the plurality of solder interconnects 223. The integrated device 130 may be configured to be electrically coupled to the integrated device 105 through an electrical path that includes a solder interconnect from the plurality of solder interconnects 131, metallization interconnects from the metallization portion 104, and a solder interconnect from the plurality of solder interconnects 225.

The integrated device 130 may be configured to be electrically coupled to the optical integrated device 101 through an electrical path 355 that includes a solder interconnect from the plurality of solder interconnects 131, metallization interconnects from the metallization portion 104, and a solder interconnect from the plurality of solder interconnects 310. The electrical path 355 may include an electrical path between the integrated device 130 and the integrated device 134. The electrical path between the integrated device 130 and the integrated device 134 may include a die interconnect from the integrated device 130, a through substrate via from the integrated device 130, a solder interconnect from the plurality of solder interconnects 133, a die interconnect from the integrated device 132, a through substrate via from the integrated device 132, a solder interconnect from the plurality of solder interconnects

135, and a die interconnect from the integrated device 134. In some implementations, there may be pillar interconnects between (i) the integrated device 130 and the integrated device 132 and/or (ii) the integrated device 132 and the integrated device 134. In such instances, the electrical path between the integrated device 130 and the integrated device 134 may also include the above mentioned pillar interconnects.

The integrated device 103 may be configured to be electrically coupled to the optical integrated device 101 through an electrical path 353 that includes a solder interconnect from the plurality of solder interconnects 223, metallization interconnects from the metallization portion 104, and a solder interconnect from the plurality of solder interconnects 310.

The integrated device 105 may be configured to be electrically coupled to the optical integrated device 101 through an electrical path 357 that includes a solder interconnect from the plurality of solder interconnects 225, metallization interconnects from the metallization portion 104, and a solder interconnect from the plurality of solder interconnects 310.

In some implementations, an optical signal may be received by the optical integrated device 101 through the optical fiber 110. The optical signal may be converted into an electrical signal by the optical integrated device 101 and the electrical signal may be sent to the integrated device 103, the integrated device 105 and/or the integrated device 130, using one or more of the electrical paths described above.

In some implementations, an electrical signal may be received by the optical integrated device 101 through one or more of the electrical paths described above. The electrical signal may be converted into an optical signal by the optical integrated device 101, and the optical signal may be sent through the optical fiber 110.

Figure 4:
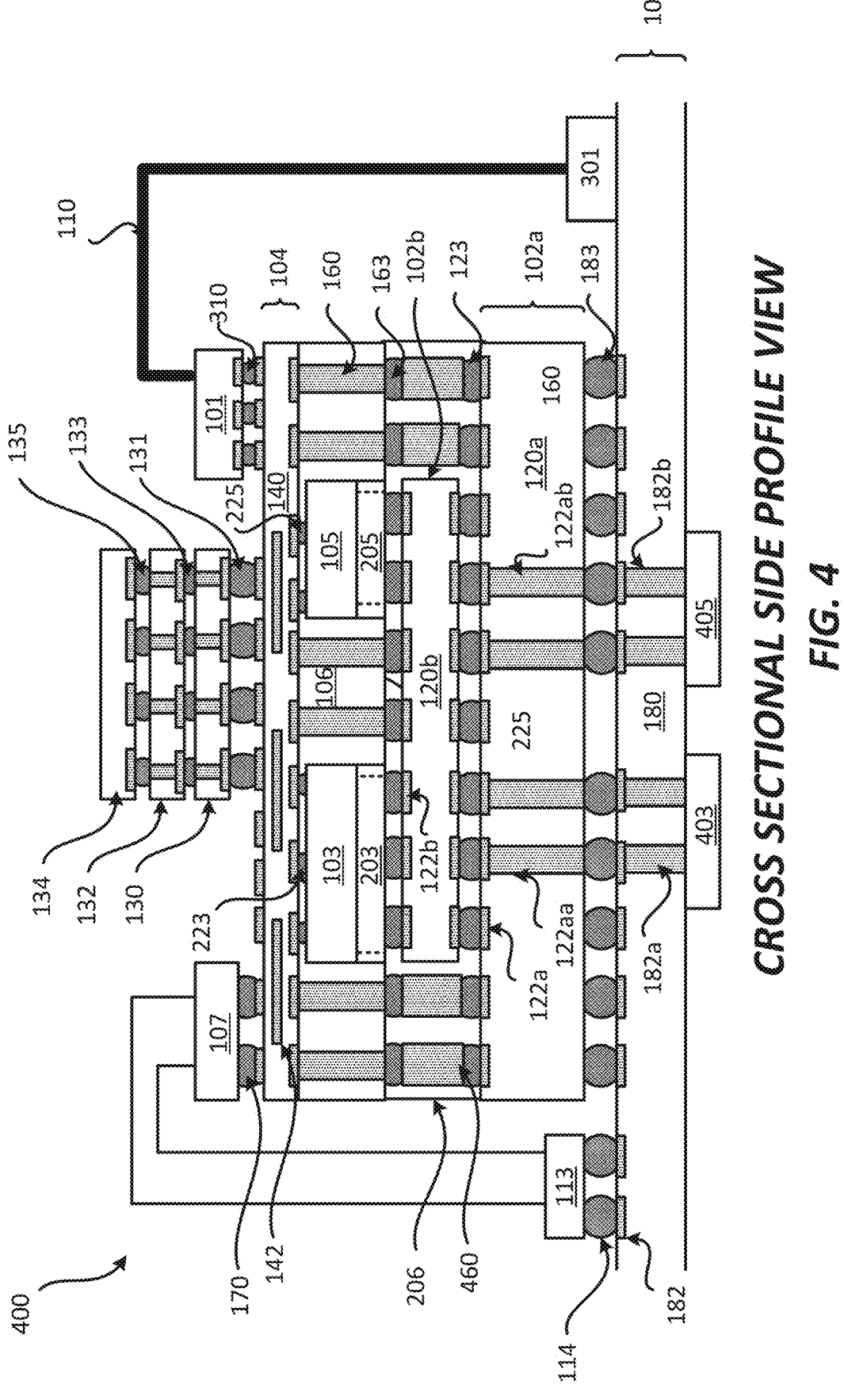
FIG. 4 illustrates a cross sectional profile view of an exemplary package comprising an optical integrated device.

FIG. 4 illustrates a cross sectional profile view of a package 400 that includes an optical integrated device. The package 400 includes an optical integrated device 101, a package substrate 102a, an integrated device 103, a metallization portion 104, an integrated device 105, an integrated device 109, a connector socket 107, a passive device 111, an integrated device 130, an integrated device 132, an integrated device 134, a plurality of post interconnects 160, an encapsulation layer 106, at least one back side power rail interconnect 203, and at least one back side power rail interconnect 205.

The package 400 is similar to the package 300. However, some of the components of the package 400 are located and/or coupled differently than some of the components in the package 300. For example, the package substrate 102a includes an interconnect 122aa and an interconnect 122ab. The interconnect 122aa and the interconnect 122ab are configured as a heat spreader in the package substrate 102a. The board 108 includes a board interconnect 182a and a board interconnect 182b. A heat sink 403 is coupled to the board 108. A thermal interface material may be used to couple the heat sink 403 to the board 108. A heat sink 405 is coupled to the board 108. A thermal interface material may be used to couple the heat sink 405 to the board 108. Heat that is generated by the integrated device 103 and/or the back side power rail interconnect 203 may dissipate through a solder interconnect from the plurality of solder interconnects 123, the interconnect 122aa, a solder interconnect from the plurality of solder interconnects 183, a board interconnect 182a and the heat sink 403. Heat that is generated by the integrated device 105 and/or the back side power rail interconnect 205 may dissipate through a solder interconnect from the plurality of solder interconnects 123, the interconnect 122ab, a solder interconnect from the plurality of solder interconnects 183, a board interconnect 182b and the heat sink 405.

In another example, a plurality of via interconnects 460 may be located in the encapsulation layer 206. The plurality of via interconnects 460 may be located laterally to the package substrate 102b. The plurality of via interconnects 460 may be coupled to the plurality of solder interconnects 123 and the plurality of solder interconnects 163.

In some implementations, the integrated device 103 may be a first chiplet and the integrated device 105 may be a second chiplet. The integrated device 103 may be configured to perform a first plurality of functions and/or operations. The integrated device 105 may be configured to perform a second plurality of functions and/or operations. The second plurality of functions and/or operations includes at least one function and/or operation that is different from the first plurality of functions and/or operations. In some implementations, the integrated device 103 may be fabricated using a first technology node, and the integrated device 105 may be fabricated using a second technology node that is not as advanced as the first technology node.

Figure 5:
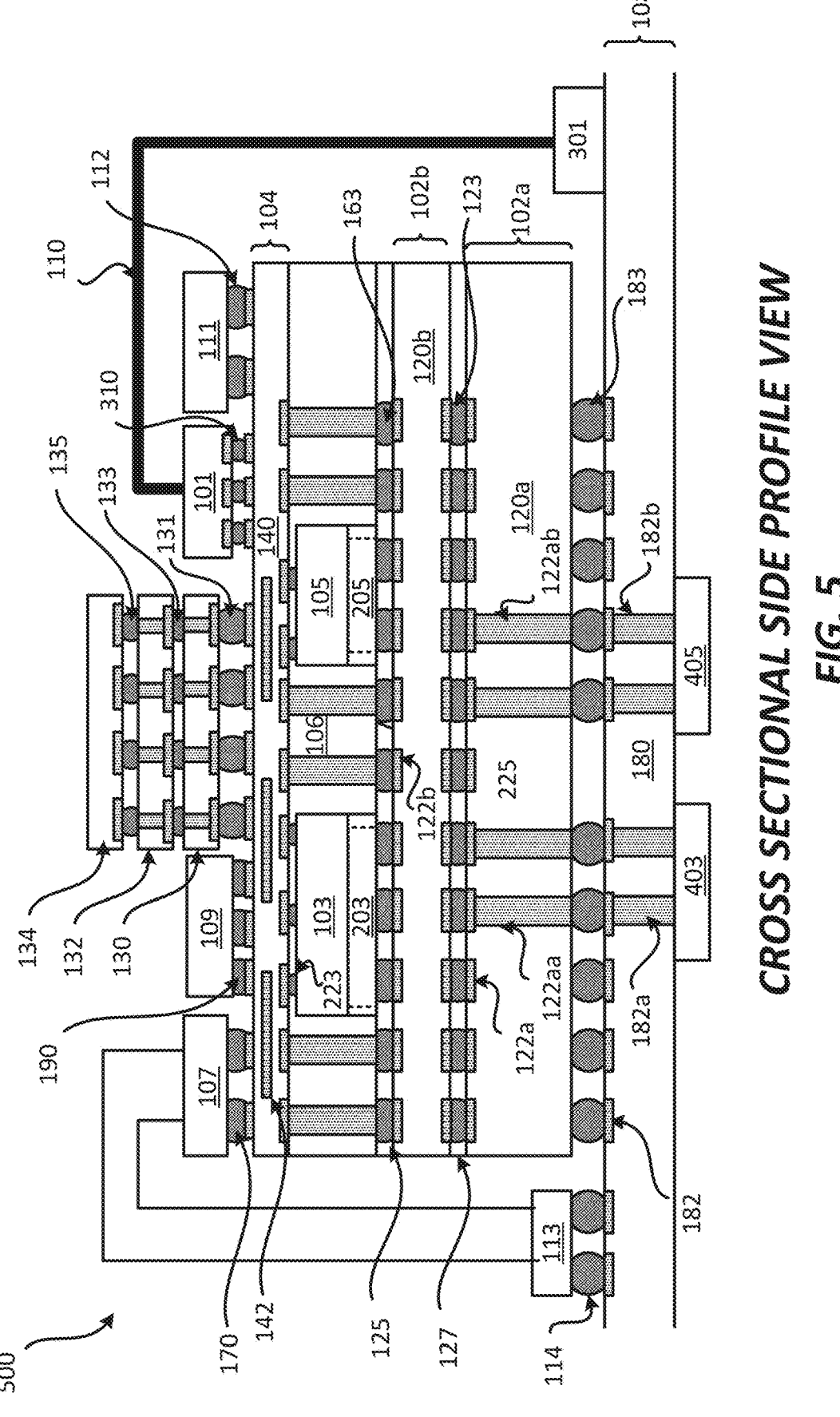
FIG. 5 illustrates a cross sectional profile view of an exemplary package comprising an optical integrated device.

FIG. 5 illustrates a cross sectional profile view of a package 500 that includes an optical integrated device. The package 500 includes an optical integrated device 101, a package substrate 102a, a package substrate 102b, an integrated device 103, a metallization portion 104, an integrated device 105, an integrated device 109, a connector socket 107, a passive device 111, an integrated device 130, an integrated device 132, an integrated device 134, a plurality of post interconnects 160, an encapsulation layer 106, at least one back side power rail interconnect 203, and at least one back side power rail interconnect 205.

The package 500 is similar to the package 300 and/or the package 400. However, some of the components of the package 500 are located and/or coupled differently than some of the components in the package 300 and/or the package 400.

As shown in FIG. 5, the optical integrated device 101 is coupled to a top surface (e.g., second integrated device) of the metallization portion 104 through the plurality of solder interconnects 310. The integrated device 109 is coupled to a top surface of the metallization portion 104 through the plurality of solder interconnects 190. The passive device 111 is coupled to a top surface of the metallization portion 104 through the plurality of solder interconnects 112.

In some implementations, an optical signal may be received by the optical integrated device 101 through the optical fiber 110. The optical signal may be converted into an electrical signal by the optical integrated device 101 and the electrical signal may be sent to the integrated device 103, the integrated device 105 and/or the integrated device 130, using one or more of the electrical paths described above in at least FIG. 3.

In some implementations, an electrical signal may be received by the optical integrated device 101 through one or more of the electrical paths described above in at least FIG. 3. The electrical signal may be converted into an optical signal by the optical integrated device 101, and the optical signal may be sent through the optical fiber 110.

FIG. 5 illustrates that the package substrate 102b is coupled to the package substrate 102a through the plurality of solder interconnects 123. The integrated device 103 is coupled to the package substrate 102b through a plurality of solder interconnects 163. The integrated device 105 is coupled to the package substrate 102b through a plurality of solder interconnects 163. An underfill 125 may at least partially encapsulate the plurality of solder interconnects 163. An underfill 125 may at least partially encapsulate the plurality of solder interconnects 123. The underfill 125 and/or the underfill 127 may each be an encapsulation layer.

Figure 6:
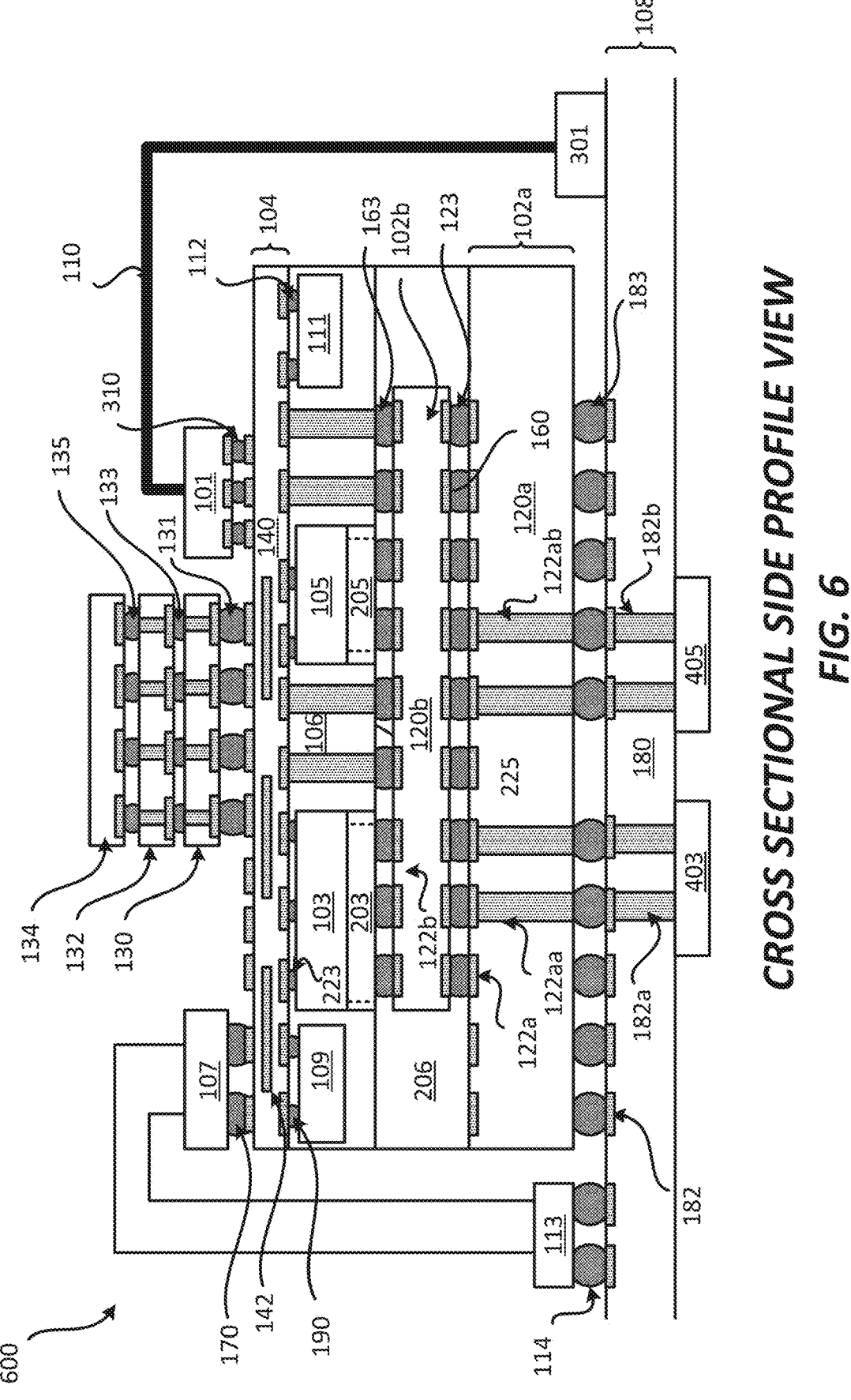
FIG. 6 illustrates a cross sectional profile view of an exemplary package comprising an optical integrated device.

FIG. 6 illustrates a cross sectional profile view of a package 600 that includes an optical integrated device. The package 600 includes an optical integrated device 101, a package substrate 102a, an integrated device 103, a metallization portion 104, an integrated device 105, an integrated device 109, a connector socket 107, a passive device 111, an integrated device 130, an integrated device 132, an integrated device 134, a plurality of post interconnects 160, an encapsulation layer 106, at least one back side power rail interconnect 203, and at least one back side power rail interconnect 205.

The package 600 is similar to the package 300 and/or the package 400. However, some of the components of the package 600 are located and/or coupled differently than some of the components in the package 300 and/or the package 400.

The package substrate 102a includes an interconnect 122aa and an interconnect 122ab. The interconnect 122aa and the interconnect 122ab are configured as a heat spreader in the package substrate 102a. The board 108 includes a board interconnect 182a and a board interconnect 182b. A heat sink 403 is coupled to the board 108. A thermal interface material may be used to couple the heat sink 403 to the board 108. A heat sink 405 is coupled to the board 108. A thermal interface material may be used to couple the heat sink 405 to the board 108. Heat that is generated by the integrated device 103 and/or the back side power rail interconnect 203 may dissipate through a solder interconnect from the plurality of solder interconnects 123, the interconnect 122aa, a solder interconnect from the plurality of solder interconnects 183, a board interconnect 182a and the heat sink 403. Heat that is generated by the integrated device 105 and/or the back side power rail interconnect 205 may dissipate through a solder interconnect from the plurality of solder interconnects 123, the interconnect 122ab, a solder interconnect from the plurality of solder interconnects 183, a board interconnect 182b and the heat sink 405.

In some implementations, an optical signal may be received by the optical integrated device 101 through the optical fiber 110. The optical signal may be converted into an electrical signal by the optical integrated device 101 and the electrical signal may be sent to the integrated device 103, the integrated device 105 and/or the integrated device 130, using one or more of the electrical paths described above in at least FIG. 3.

In some implementations, an electrical signal may be received by the optical integrated device 101 through one or more of the electrical paths described above in at least FIG. 3. The electrical signal may be converted into an optical signal by the optical integrated device 101, and the optical signal may be sent through the optical fiber 110.

FIG. 6 illustrates that the package substrate 102b is coupled to the package substrate 102a through the plurality of solder interconnects 123. The integrated device 103 is coupled to the package substrate 102b through a plurality of solder interconnects 163. The integrated device 105 is coupled to the package substrate 102b through a plurality of solder interconnects 163. An encapsulation layer 206 may at least partially encapsulate the package substrate 102b, the plurality of solder interconnects 163 and/or the plurality of solder interconnects 123.

It is noted that any of the packages may include additional components and/or other components. For example, an integrated device may be replaced with a stack of integrated devices. For example, the integrated device 103 and/or the integrated device 105 may each be replaced with a stack of integrated devices (e.g., similar to the integrated device 130, the integrated device 132, and the integrated device 134). The stack of integrated devices may include front to front facing integrated devices, front to back facing integrated devices and/or back to back facing integrated devices. In another example, a substrate and/or an interposer may be located between the package substrate 102a and the integrated device 103 and/or the integrated device 105.

It is noted that any of the plurality of solder interconnects described in the disclosure may be implemented as a plurality of bump interconnects. A bump interconnect may include a pillar interconnect and a solder interconnect. In some implementations, a plurality of bump interconnects may include a plurality of micro bump interconnects. A micro bump interconnect may be similar to a bump interconnect. However, the micro bump interconnect may have smaller dimensions than a bump interconnect, to accommodate finer interconnect pitches. For example, in some implementations, the plurality of solder interconnects 123 and/or the plurality of solder interconnects 163 may be implemented as a plurality of micro bump interconnects, while the plurality of solder interconnects 183 may be implemented as a plurality of bump interconnects. In some implementations, one or more bump interconnects may have a pitch (e.g., minimum pitch) in a range of about 80-120 micrometers. In some implementations, one or more micro bump interconnects may have a pitch (e.g., minimum pitch) in a range of about 25-50 micrometers.

Exemplary Optical Integrated Devices

FIG. 7 illustrates an exemplary optical integrated device 700. The optical integrated device 700 may be the optical integrated device 101 described FIGS. 1-6 and 9-16. The optical integrated device 700 includes a substrate 702 (e.g., silicon substrate), an optical device 704, a waveguide 706, a waveguide 708, a waveguide 709, an oxide layer 710, a plurality of interconnects 730 and a fiber ferrule 720. The optical fiber 110 is coupled to the waveguide 706 and the fiber ferrule 720. An optical signal from the optical fiber 110 may travel through the waveguide 706, the waveguide 709 and the waveguide 708. The optical signal may be processed by the optical device 704, where the optical signal may be converted into an electrical signal. The electrical signal may be sent through the plurality of interconnects 730. The oxide layer 710 may surround the waveguide 709 and the waveguide 708. The waveguide 709 may include silicon (S) or silicon nitride. The waveguide 709 may extend through a thickness of the substrate 702 like a through silicon via (TSV). The waveguide 708 may include silicon (S), germanium (Ge) or silicon nitride.

Figure 8:
FIG. 8 illustrates a cross sectional profile view of an exemplary optical integrated device.

FIG. 8 illustrates an exemplary optical integrated device 800. The optical integrated device 800 may be the optical integrated device 101 described FIGS. 1-6. The optical integrated device 800 includes a substrate 702 (e.g., silicon substrate), an optical device 704, a waveguide 706, a plurality of interconnects 830, a plurality of interconnects 840 and a fiber ferrule 720. The optical fiber 110 is coupled to the waveguide 706 and the fiber ferrule 720. An optical signal from the optical fiber 110 may travel through the waveguide 706. The optical signal may be processed by the optical device 704, where the optical signal may be converted into an electrical signal. The electrical signal may be sent through the plurality of interconnects 830 and/or the plurality of interconnects 840.

Although not shown, the fiber ferrule 720 may be coupled to a carrier (e.g., silicon carrier) and the carrier is used to help couple the fiber ferrule 720 to the waveguide 706. In some implementations, there may be more than one optical fiber.

Different implementations may use different waveguide designs. In some implementations, a waveguide may include silicon ridge waveguide, a silicon rib waveguide, a silicon slot waveguide and/or silicon nitride ridge waveguide. However, other implementations may use other waveguide designs. For example, some implementations may use germanium in conjunction with silicon.

Exemplary Package Comprising an Optical Integrated Device

Figure 9:
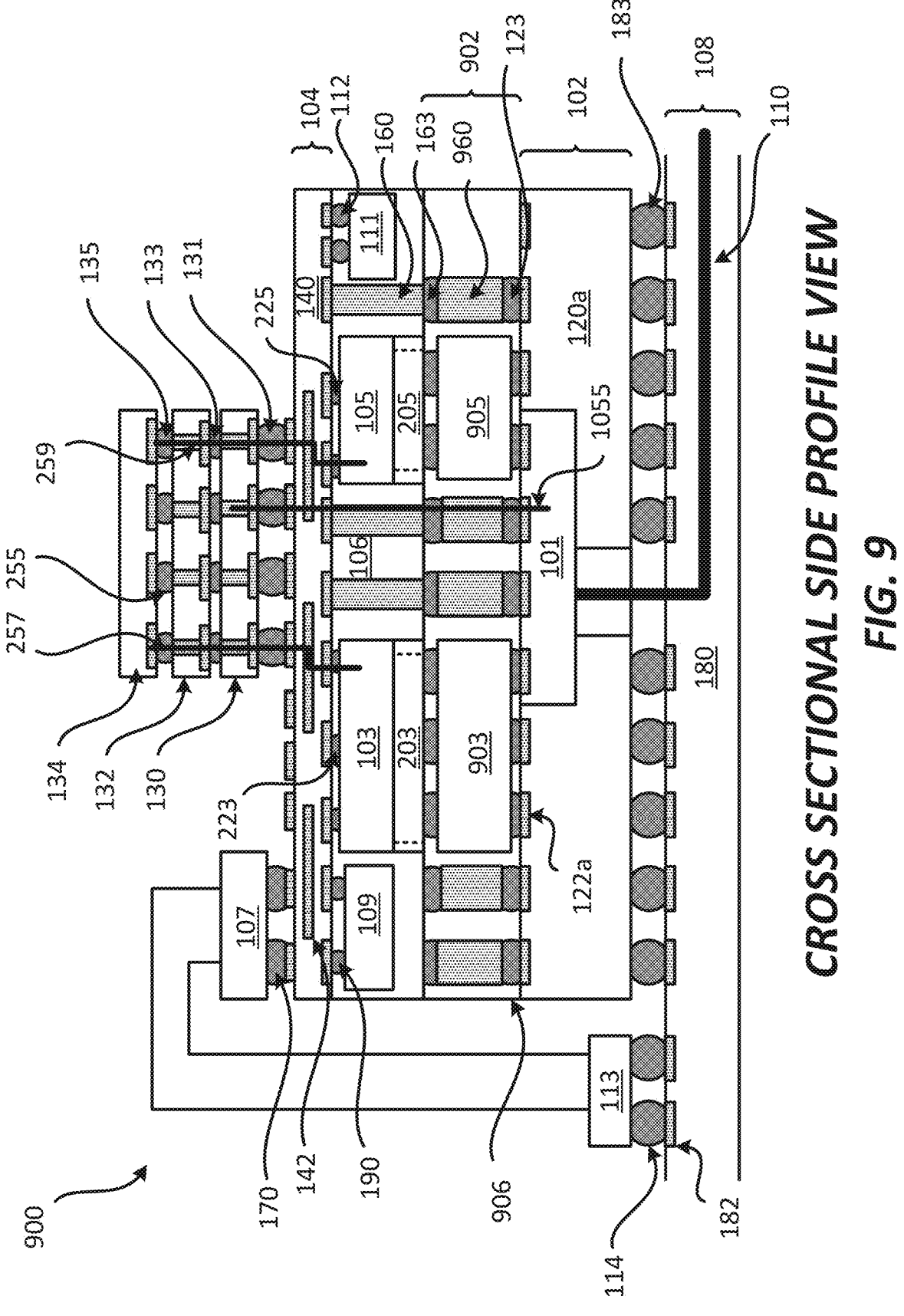
FIG. 9 illustrates a cross sectional profile view of an exemplary package comprising an optical integrated device.

FIG. 9 illustrates a cross sectional profile view of a package 900 that includes an optical integrated device. The package 900 includes an optical integrated device 101, a package substrate 102, an intermediate portion 902, an integrated device 103, a metallization portion 104, an integrated device 105, an integrated device 109, a connector socket 107, a passive device 111, an integrated device 130, an integrated device 132, an integrated device 134, a plurality of post interconnects 160, an encapsulation layer 106, at least one back side power rail interconnect 203, and at least one back side power rail interconnect 205.

The package 900 is similar to the package 200. However, some of the components of the package 900 are located and/or coupled differently than some of the components in the package 200.

The intermediate portion 902 is coupled to the package substrate 102 through a plurality of solder interconnects 123. The intermediate portion 902 is coupled to the optical integrated device 101 through a plurality of solder interconnects 123. The intermediate portion 902 is coupled to the integrated device 103 and/or the integrated device 105 through a plurality of solder interconnects 163. The intermediate portion 902 includes an encapsulation layer 906, an integrated device 903, an integrated device 905, a plurality of via interconnects 960. In some implementations, the plurality of solder interconnects 123 and/or the plurality of solder interconnects 163 may be considered part of the intermediate portion 902.

The integrated device 903 is coupled to the integrated device 103 through solder interconnects from the plurality of solder interconnects 163. The integrated device 905 is coupled to the integrated device 105 through solder interconnects from the plurality of solder interconnects 163. The integrated device 903 is coupled to the optical integrated device 101 through solder interconnects from the plurality of solder interconnects 123. The integrated device 905 is coupled to the optical integrated device 101 through solder interconnects from the plurality of solder interconnects 123. The optical integrated device 101 may be configured as a bridge (for electrical paths) between the integrated device 903 and the integrated device 905. The integrated device 903 and the integrated device 103 may be stacked integrated devices. The integrated device 905 and the integrated device 105 may be stacked integrated devices.

FIG. 9 illustrates an electrical path 1055 between the integrated device 130 and the optical integrated device 101. The electrical path 1055 may include at least one solder interconnect from the plurality of solder interconnects 131, at least one metallization interconnect from the plurality of metallization interconnects 142, at least one post internect from the plurality of post interconnects 160, at least one solder interconnect from the plurality of solder interconnects 163, at least one post interconnect from the plurality of via interconnects 960, and/or at least one solder interconnect from the plurality of solder interconnects 123.

Figure 10:
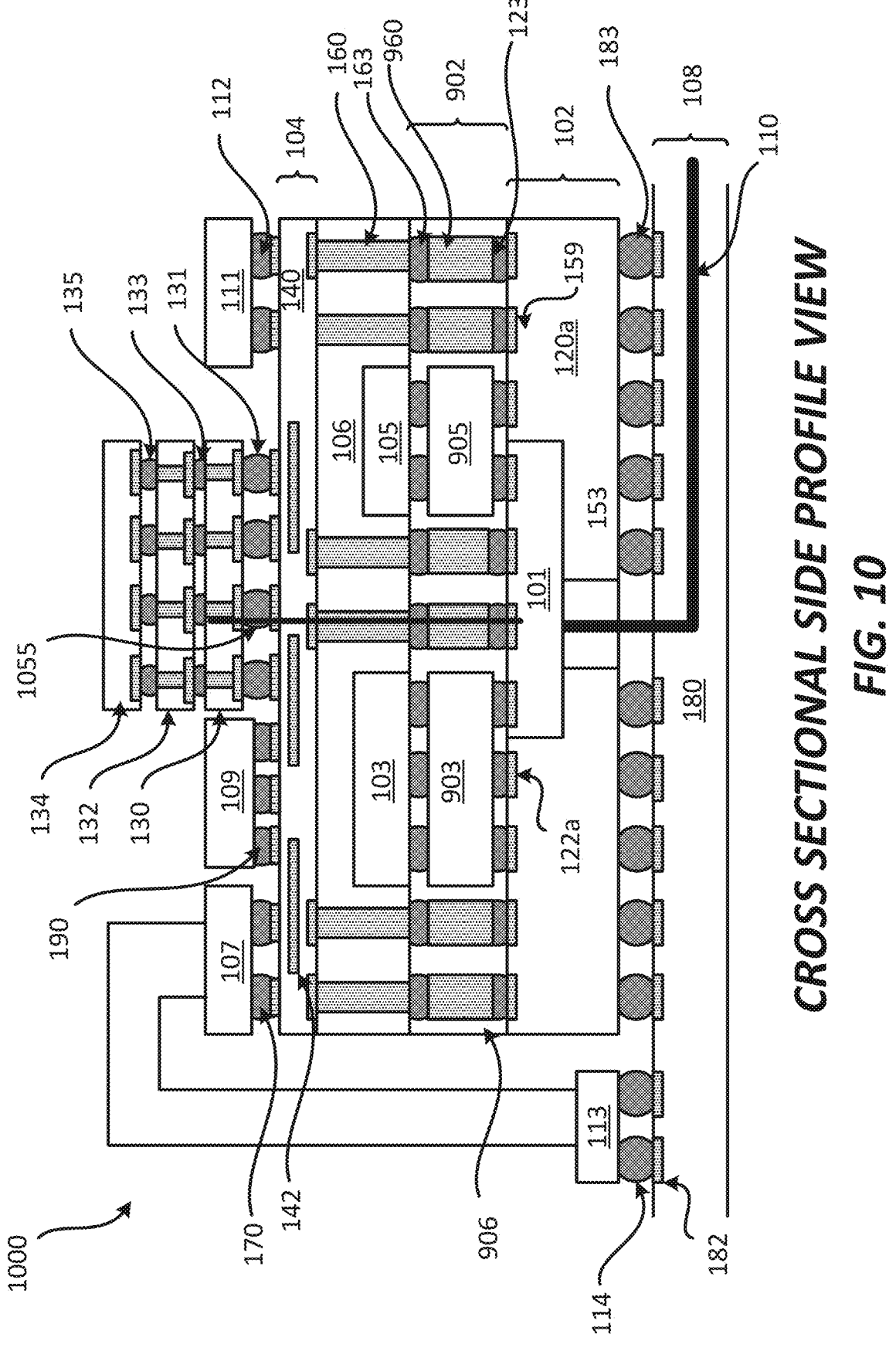
FIG. 10 illustrates a cross sectional profile view of an exemplary package comprising an optical integrated device.

FIG. 10 illustrates a cross sectional profile view of a package 1000 that includes an optical integrated device. The package 1000 includes an optical integrated device 101, a package substrate 102, an intermediate portion 902, an integrated device 103, a metallization portion 104, an integrated device 105, an integrated device 109, a connector socket 107, a passive device 111, an integrated device 130, an integrated device 132, an integrated device 134, a plurality of post interconnects 160, an encapsulation layer 106, at least one back side power rail interconnect 203, and at least one back side power rail interconnect 205.

The package 1000 is similar to the package 100. However, some of the components of the package 1000 are located and/or coupled differently than some of the components in the package 100.

The intermediate portion 902 is coupled to the package substrate 102 through a plurality of solder interconnects 123. The intermediate portion 902 is coupled to the optical integrated device 101 through a plurality of solder interconnects 123. The intermediate portion 902 is coupled to the integrated device 103 and/or the integrated device 105 through a plurality of solder interconnects 163. The intermediate portion 902 includes an encapsulation layer 906, an integrated device 903, an integrated device 905, a plurality of via interconnects 960. In some implementations, the plurality of solder interconnects 123 and/or the plurality of solder interconnects 163 may be considered part of the intermediate portion 902.

The integrated device 903 is coupled to the integrated device 103 through solder interconnects from the plurality of solder interconnects 163. The integrated device 905 is coupled to the integrated device 105 through solder interconnects from the plurality of solder interconnects 163. The integrated device 903 is coupled to the optical integrated device 101 through solder interconnects from the plurality of solder interconnects 123. The integrated device 905 is coupled to the optical integrated device 101 through solder interconnects from the plurality of solder interconnects 123. The optical integrated device 101 may be configured as a bridge (for electrical paths) between the integrated device 903 and the integrated device 905. The integrated device 903 and the integrated device 103 may be stacked integrated devices. The integrated device 905 and the integrated device 105 may be stacked integrated devices.

Figure 11:
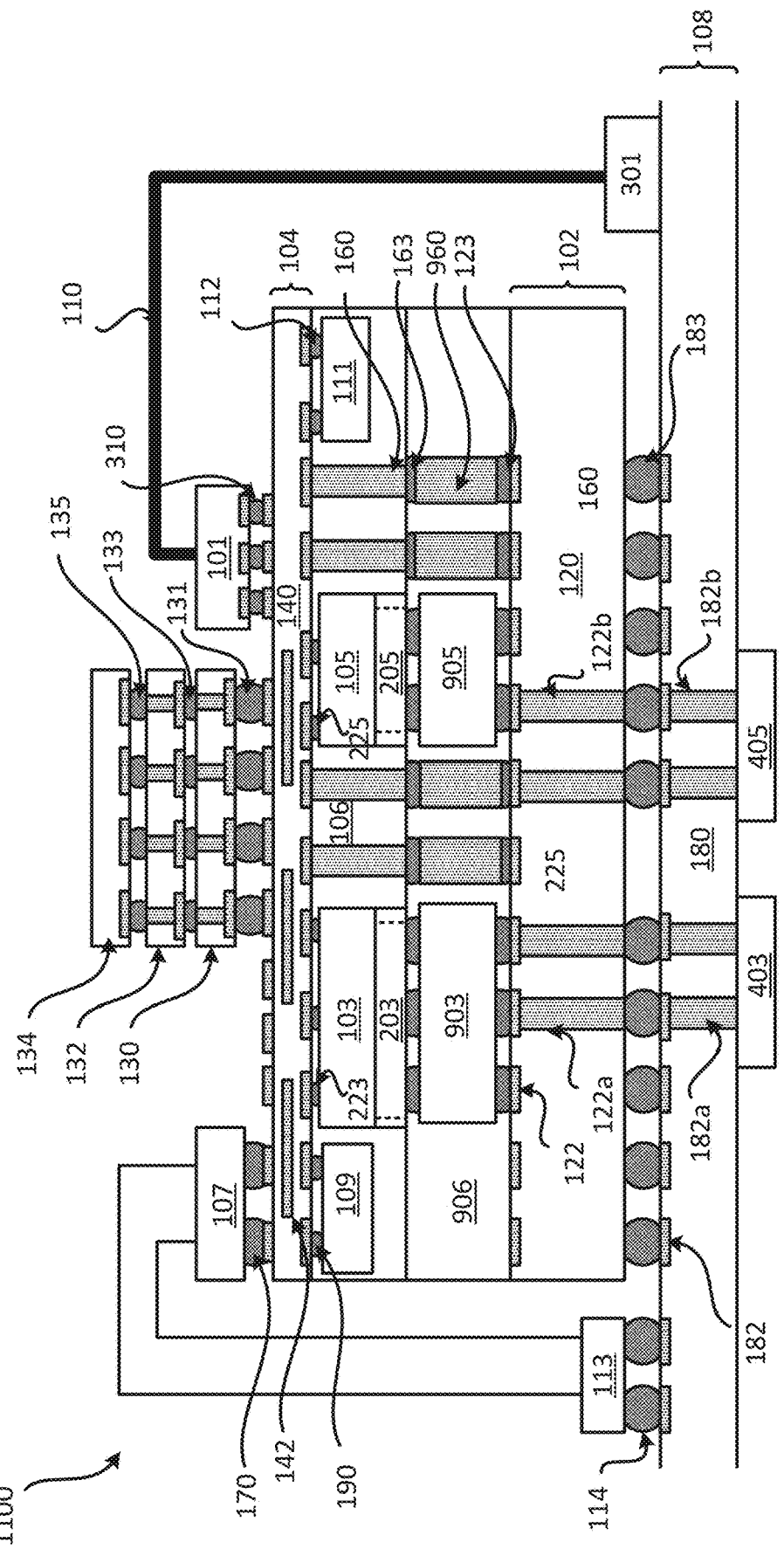
FIG. 11 illustrates a cross sectional profile view of an exemplary package comprising an optical integrated device.

FIG. 11 illustrates a cross sectional profile view of a package 1100 that includes an optical integrated device. The package 1100 includes an optical integrated device 101, a package substrate 102, an intermediate portion 902, an integrated device 103, a metallization portion 104, an integrated device 105, an integrated device 109, a connector socket 107, a passive device 111, an integrated device 130, an integrated device 132, an integrated device 134, a plurality of post interconnects 160, an encapsulation layer 106, at least one back side power rail interconnect 203, and at least one back side power rail interconnect 205.

The package 1100 is similar to the package 400. However, some of the components of the package 1100 are located and/or coupled differently than some of the components in the package 400.

The intermediate portion 902 is coupled to the package substrate 102 through a plurality of solder interconnects 123. The intermediate portion 902 is coupled to the optical integrated device 101 through a plurality of solder interconnects 123. The intermediate portion 902 is coupled to the integrated device 103 and/or the integrated device 105 through a plurality of solder interconnects 163. The intermediate portion 902 includes an encapsulation layer 906, an integrated device 903, an integrated device 905, a plurality of via interconnects 960. In some implementations, the plurality of solder interconnects 123 and/or the plurality of solder interconnects 163 may be considered part of the intermediate portion 902.

The integrated device 903 is coupled to the integrated device 103 through solder interconnects from the plurality of solder interconnects 163. The integrated device 905 is coupled to the integrated device 105 through solder interconnects from the plurality of solder interconnects 163. The integrated device 903 is coupled to the optical integrated device 101 through solder interconnects from the plurality of solder interconnects 123. The integrated device 905 is coupled to the optical integrated device 101 through solder interconnects from the plurality of solder interconnects 123. The optical integrated device 101 may be configured as a bridge (for electrical paths) between the integrated device 903 and the integrated device 905. The integrated device 903 and the integrated device 103 may be stacked integrated devices. The integrated device 905 and the integrated device 105 may be stacked integrated devices.

Figure 12:
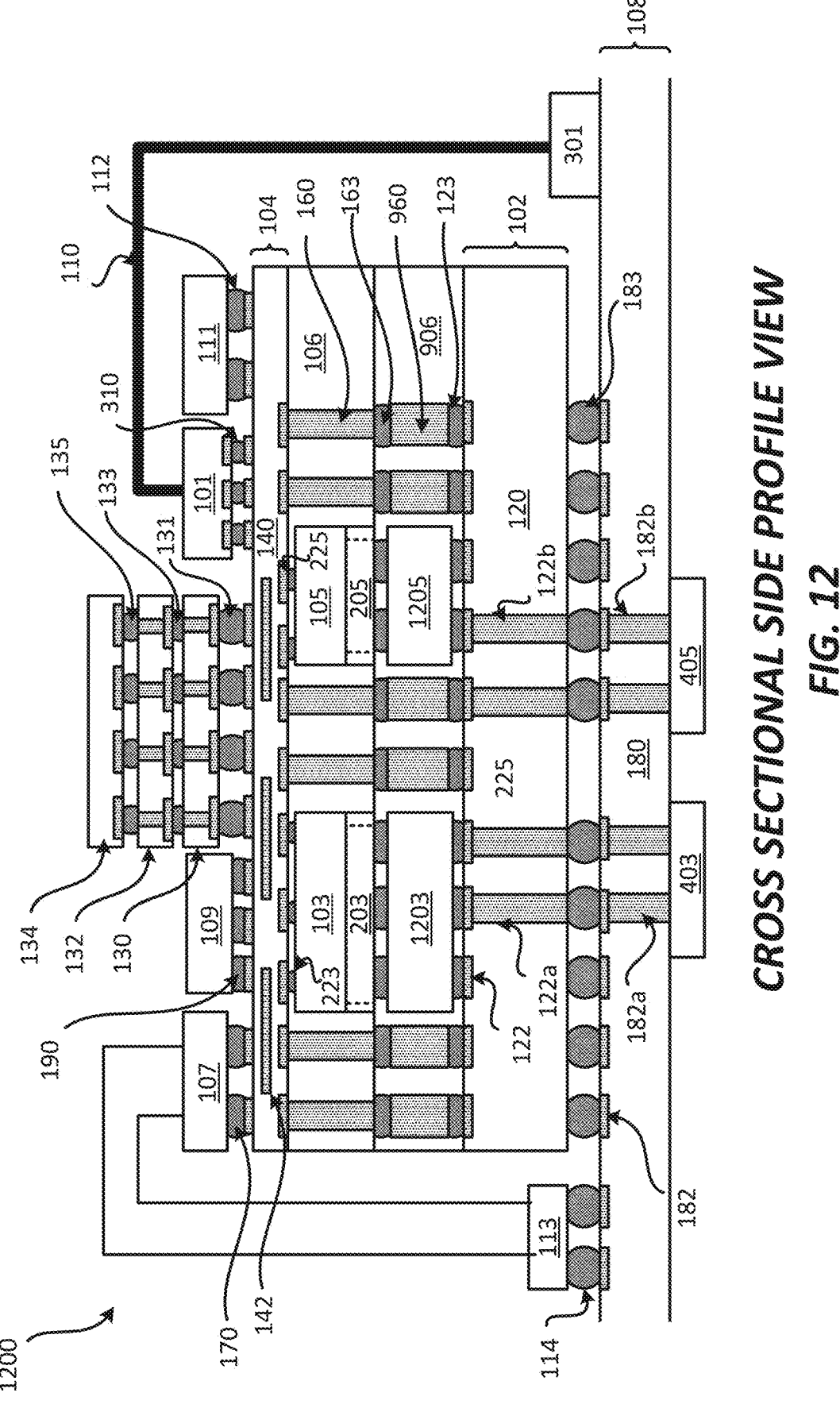
FIG. 12 illustrates a cross sectional profile view of an exemplary package comprising an optical integrated device.

FIG. 12 illustrates a cross sectional profile view of a package 1200 that includes an optical integrated device. The package 1200 includes an optical integrated device 101, a package substrate 102, an intermediate portion 902, an integrated device 103, a metallization portion 104, an integrated device 105, an integrated device 109, a connector socket 107, a passive device 111, an integrated device 130, an integrated device 132, an integrated device 134, a plurality of post interconnects 160, an encapsulation layer 106, at least one back side power rail interconnect 203, and at least one back side power rail interconnect 205.

The package 1200 is similar to the package 500. However, some of the components of the package 1200 are located and/or coupled differently than some of the components in the package 500.

The intermediate portion 902 is coupled to the package substrate 102 through a plurality of solder interconnects 123. The intermediate portion 902 is coupled to the optical integrated device 101 through a plurality of solder interconnects 123. The intermediate portion 902 is coupled to the integrated device 103 and/or the integrated device 105 through a plurality of solder interconnects 163. The intermediate portion 902 includes an encapsulation layer 906, an integrated device 903, an integrated device 905, a plurality of via interconnects 960. In some implementations, the plurality of solder interconnects 123 and/or the plurality of solder interconnects 163 may be considered part of the intermediate portion 902.

The integrated device 903 is coupled to the integrated device 103 through solder interconnects from the plurality of solder interconnects 163. The integrated device 905 is coupled to the integrated device 105 through solder interconnects from the plurality of solder interconnects 163. The integrated device 903 is coupled to the optical integrated device 101 through solder interconnects from the plurality of solder interconnects 123. The integrated device 905 is coupled to the optical integrated device 101 through solder interconnects from the plurality of solder interconnects 123. The optical integrated device 101 may be configured as a bridge (for electrical paths) between the integrated device 903 and the integrated device 905. The integrated device 903 and the integrated device 103 may be stacked integrated devices. The integrated device 905 and the integrated device 105 may be stacked integrated devices.

Figure 13:
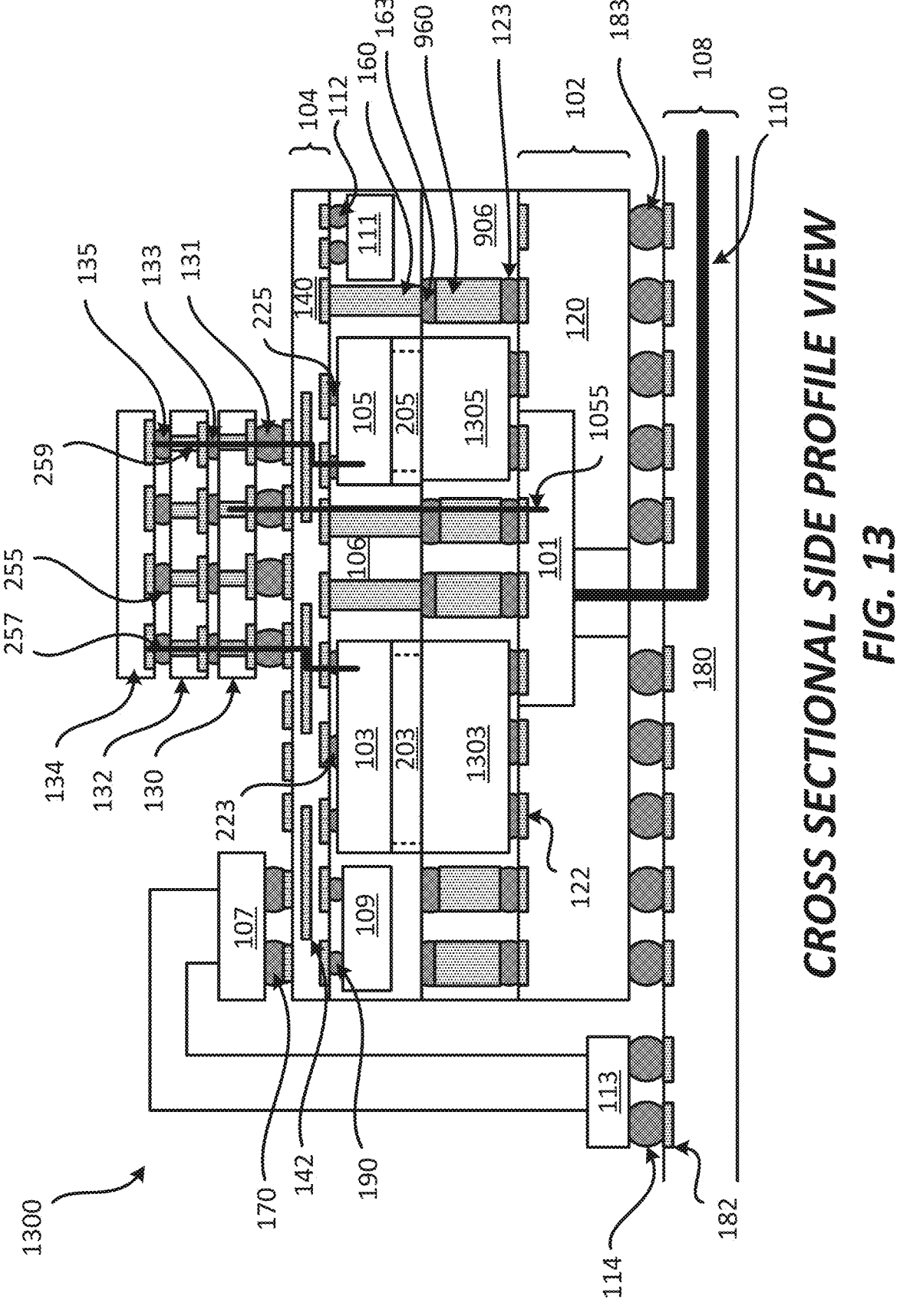
FIG. 13 illustrates a cross sectional profile view of an exemplary package comprising an optical integrated device.

FIG. 13 illustrates a cross sectional profile view of a package 1300 that includes an optical integrated device. The package 900 includes an optical integrated device 101, a package substrate 102, an intermediate portion 902, an integrated device 103, a metallization portion 104, an integrated device 105, an integrated device 109, a connector socket 107, a passive device 111, an integrated device 130, an integrated device 132, an integrated device 134, a plurality of post interconnects 160, an encapsulation layer 106, at least one back side power rail interconnect 203, and at least one back side power rail interconnect 205.

The package 1300 is similar to the package 200 and/or the package 900. However, some of the components of the package 1300 are located and/or coupled differently than some of the components in the package 200 and/or the package 900.

The intermediate portion 902 is coupled to the package substrate 102 through a plurality of solder interconnects 123. The intermediate portion 902 is coupled to the optical integrated device 101 through a plurality of solder interconnects 123. The intermediate portion 902 is coupled to the integrated device 103 and/or the integrated device 105 through a plurality of solder interconnects 163. The intermediate portion 902 includes an encapsulation layer 906, an integrated device 1303, an integrated device 1305, a plurality of via interconnects 960. In some implementations, the plurality of solder interconnects 123 and/or the plurality of solder interconnects 163 may be considered part of the intermediate portion 902.

The integrated device 1303 is coupled to the integrated device 103 through direct metal to metal bonding (e.g., hybrid bonding, copper to copper bonding). That is, there is no solder interconnects between the integrated device 1303 and the integrated device 103. Thus, an electrical path between the integrated device 1303 and the integrated device 103 may be free of solder interconnects. The integrated device 1305 is coupled to the integrated device 105 through direct metal to metal bonding (e.g., hybrid bonding, copper to copper bonding). That is, there is no solder interconnects between the integrated device 1305 and the integrated device 105. Thus, an electrical path between the integrated device 1305 and the integrated device 105 may be free of solder interconnects.

The integrated device 1303 is coupled to the optical integrated device 101 through solder interconnects from the plurality of solder interconnects 123. The integrated device 1305 is coupled to the optical integrated device 101 through solder interconnects from the plurality of solder interconnects 123. The optical integrated device 101 may be configured as a bridge (for electrical paths) between the integrated device 1303 and the integrated device 1305. The integrated device 1303 and the integrated device 103 may be stacked integrated devices. The integrated device 1305 and the integrated device 105 may be stacked integrated devices.

Figure 14:
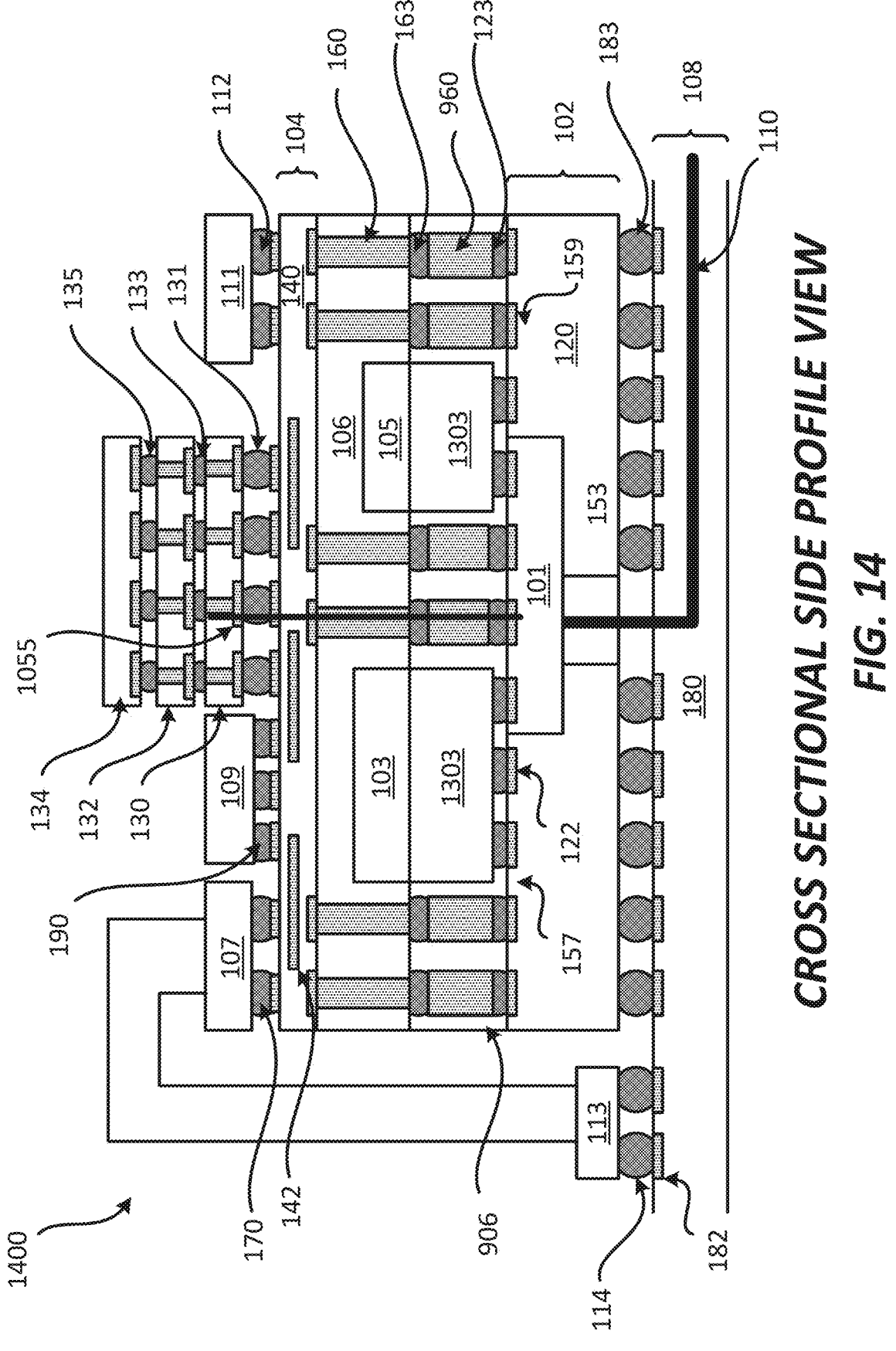
FIG. 14 illustrates a cross sectional profile view of an exemplary package comprising an optical integrated device.

FIG. 14 illustrates a cross sectional profile view of a package 1400 that includes an optical integrated device. The package 900 includes an optical integrated device 101, a package substrate 102, an intermediate portion 902, an integrated device 103, a metallization portion 104, an integrated device 105, an integrated device 109, a connector socket 107, a passive device 111, an integrated device 130, an integrated device 132, an integrated device 134, a plurality of post interconnects 160, an encapsulation layer 106, at least one back side power rail interconnect 203, and at least one back side power rail interconnect 205.

The package 1400 is similar to the package 100 and/or the package 1000. However, some of the components of the package 1400 are located and/or coupled differently than some of the components in the package 100 and/or the package 1000.

The intermediate portion 902 is coupled to the package substrate 102 through a plurality of solder interconnects 123. The intermediate portion 902 is coupled to the optical integrated device 101 through a plurality of solder interconnects 123. The intermediate portion 902 is coupled to the integrated device 103 and/or the integrated device 105 through a plurality of solder interconnects 163. The intermediate portion 902 includes an encapsulation layer 906, an integrated device 1303, an integrated device 1305, a plurality of via interconnects 960. In some implementations, the plurality of solder interconnects 123 and/or the plurality of solder interconnects 163 may be considered part of the intermediate portion 902.

The integrated device 1303 is coupled to the integrated device 103 through direct metal to metal bonding (e.g., hybrid bonding, copper to copper bonding). That is, there is no solder interconnects between the integrated device 1303 and the integrated device 103. Thus, an electrical path between the integrated device 1303 and the integrated device 103 may be free of solder interconnects. The integrated device 1305 is coupled to the integrated device 105 through direct metal to metal bonding (e.g., hybrid bonding, copper to copper bonding). That is, there is no solder interconnects between the integrated device 1305 and the integrated device 105. Thus, an electrical path between the integrated device 1305 and the integrated device 105 may be free of solder interconnects.

The integrated device 1303 is coupled to the optical integrated device 101 through solder interconnects from the plurality of solder interconnects 123. The integrated device 1305 is coupled to the optical integrated device 101 through solder interconnects from the plurality of solder interconnects 123. The optical integrated device 101 may be configured as a bridge (for electrical paths) between the integrated device 1303 and the integrated device 1305. The integrated device 1303 and the integrated device 103 may be stacked integrated devices. The integrated device 1305 and the integrated device 105 may be stacked integrated devices.

Figure 15:
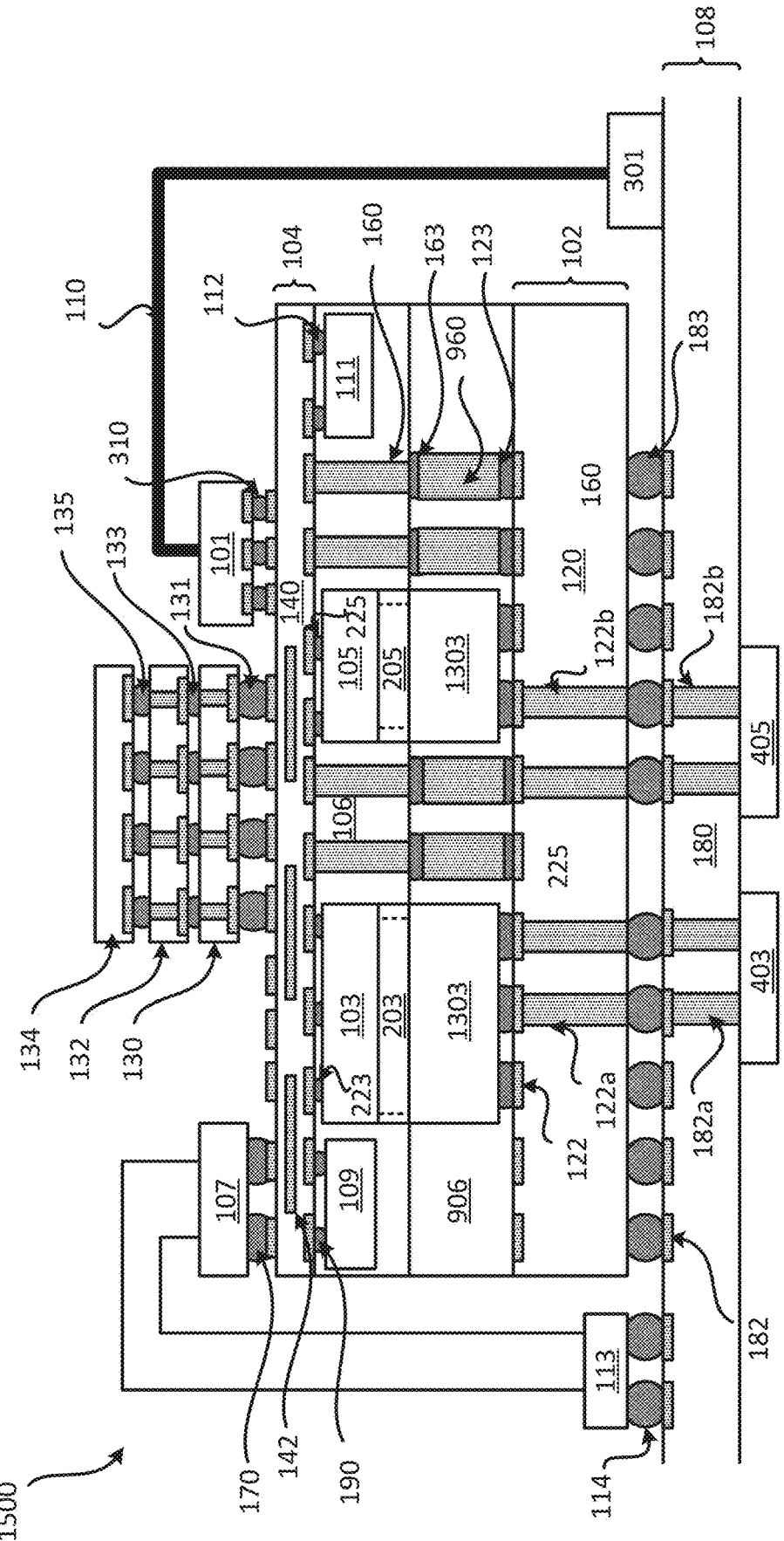
FIG. 15 illustrates a cross sectional profile view of an exemplary package comprising an optical integrated device.

FIG. 15 illustrates a cross sectional profile view of a package 1500 that includes an optical integrated device. The package 900 includes an optical integrated device 101, a package substrate 102, an intermediate portion 902, an integrated device 103, a metallization portion 104, an integrated device 105, an integrated device 109, a connector socket 107, a passive device 111, an integrated device 130, an integrated device 132, an integrated device 134, a plurality of post interconnects 160, an encapsulation layer 106, at least one back side power rail interconnect 203, and at least one back side power rail interconnect 205.

The package 1500 is similar to the package 400 and/or the package 1100. However, some of the components of the package 1500 are located and/or coupled differently than some of the components in the package 400 and/or the package 1100.

The intermediate portion 902 is coupled to the package substrate 102 through a plurality of solder interconnects 123. The intermediate portion 902 is coupled to the optical integrated device 101 through a plurality of solder interconnects 123. The intermediate portion 902 is coupled to the integrated device 103 and/or the integrated device 105 through a plurality of solder interconnects 163. The intermediate portion 902 includes an encapsulation layer 906, an integrated device 1303, an integrated device 1305, a plurality of via interconnects 960. In some implementations, the plurality of solder interconnects 123 and/or the plurality of solder interconnects 163 may be considered part of the intermediate portion 902.

The integrated device 1303 is coupled to the integrated device 103 through direct metal to metal bonding (e.g., hybrid bonding, copper to copper bonding). That is, there is no solder interconnects between the integrated device 1303 and the integrated device 103. Thus, an electrical path between the integrated device 1303 and the integrated device 103 may be free of solder interconnects. The integrated device 1305 is coupled to the integrated device 105 through direct metal to metal bonding (e.g., hybrid bonding, copper to copper bonding). That is, there is no solder interconnects between the integrated device 1305 and the integrated device 105. Thus, an electrical path between the integrated device 1305 and the integrated device 105 may be free of solder interconnects.

The integrated device 1303 is coupled to the optical integrated device 101 through solder interconnects from the plurality of solder interconnects 123. The integrated device 1305 is coupled to the optical integrated device 101 through solder interconnects from the plurality of solder interconnects 123. The optical integrated device 101 may be configured as a bridge (for electrical paths) between the integrated device 1303 and the integrated device 1305. The integrated device 1303 and the integrated device 103 may be stacked integrated devices. The integrated device 1305 and the integrated device 105 may be stacked integrated devices.

Figure 16:
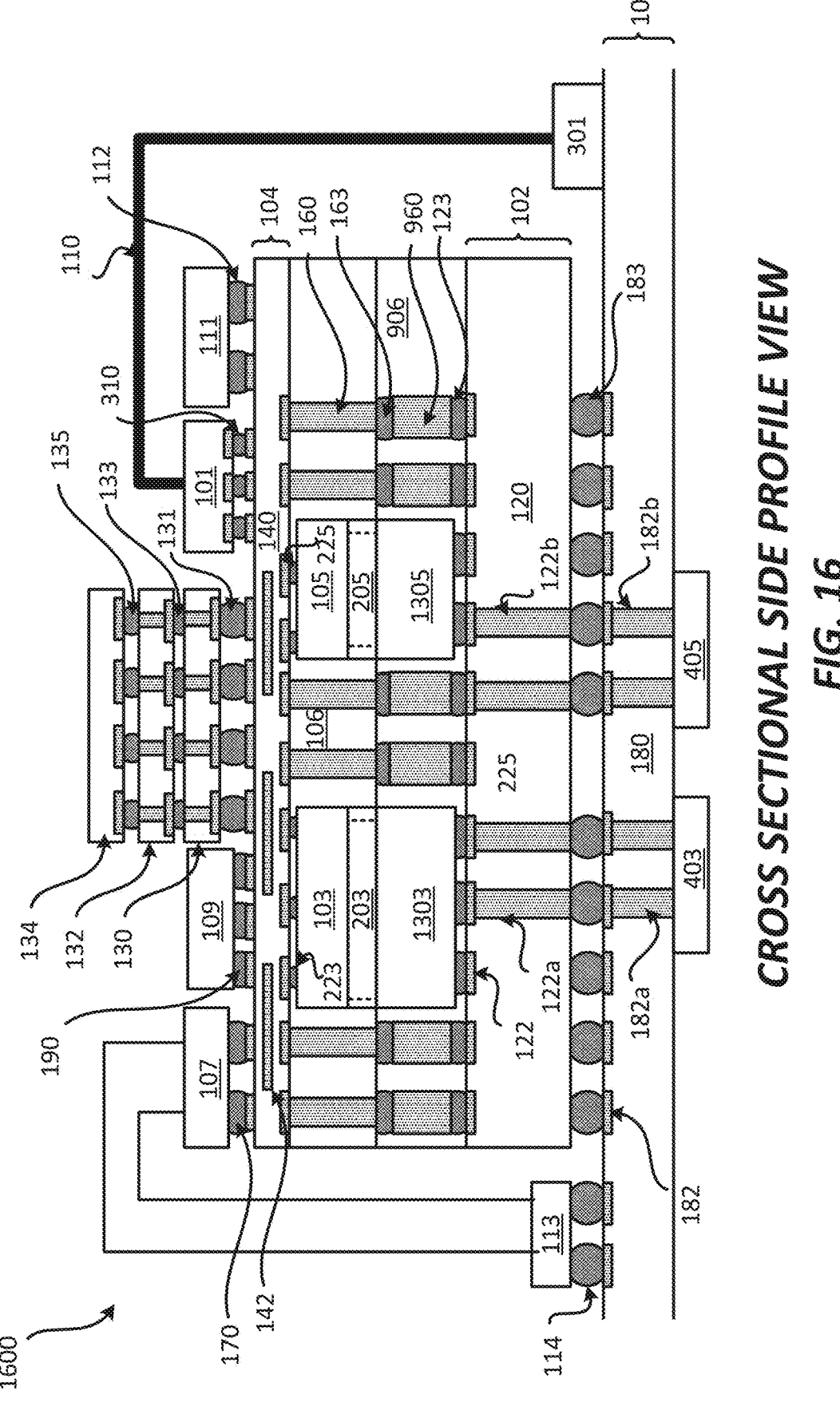
FIG. 16 illustrates a cross sectional profile view of an exemplary package comprising an optical integrated device.

FIG. 16 illustrates a cross sectional profile view of a package 1600 that includes an optical integrated device. The package 900 includes an optical integrated device 101, a package substrate 102, an intermediate portion 902, an integrated device 103, a metallization portion 104, an integrated device 105, an integrated device 109, a connector socket 107, a passive device 111, an integrated device 130, an integrated device 132, an integrated device 134, a plurality of post interconnects 160, an encapsulation layer 106, at least one back side power rail interconnect 203, and at least one back side power rail interconnect 205.

The package 1600 is similar to the package 500 and/or the package 1200. However, some of the components of the package 1600 are located and/or coupled differently than some of the components in the package 500 and/or the package 1200.

The intermediate portion 902 is coupled to the package substrate 102 through a plurality of solder interconnects 123. The intermediate portion 902 is coupled to the optical integrated device 101 through a plurality of solder interconnects 123. The intermediate portion 902 is coupled to the integrated device 103 and/or the integrated device 105 through a plurality of solder interconnects 163. The intermediate portion 902 includes an encapsulation layer 906, an integrated device 1303, an integrated device 1305, a plurality of via interconnects 960. In some implementations, the plurality of solder interconnects 123 and/or the plurality of solder interconnects 163 may be considered part of the intermediate portion 902.

The integrated device 1303 is coupled to the integrated device 103 through direct metal to metal bonding (e.g., hybrid bonding, copper to copper bonding). That is, there is no solder interconnects between the integrated device 1303 and the integrated device 103. Thus, an electrical path between the integrated device 1303 and the integrated device 103 may be free of solder interconnects. The integrated device 1305 is coupled to the integrated device 105 through direct metal to metal bonding (e.g., hybrid bonding, copper to copper bonding). That is, there is no solder interconnects between the integrated device 1305 and the integrated device 105. Thus, an electrical path between the integrated device 1305 and the integrated device 105 may be free of solder interconnects.

The integrated device 1303 is coupled to the optical integrated device 101 through solder interconnects from the plurality of solder interconnects 123. The integrated device 1305 is coupled to the optical integrated device 101 through solder interconnects from the plurality of solder interconnects 123. The optical integrated device 101 may be configured as a bridge (for electrical paths) between the integrated device 1303 and the integrated device 1305. The integrated device 1303 and the integrated device 103 may be stacked integrated devices. The integrated device 1305 and the integrated device 105 may be stacked integrated devices.

It is noted that different implementations may have different electrical paths between different components. Thus, an electrical path between components is not limited to the electrical paths shown or described in the disclosure. Other electrical paths may be possible between components. For example, an electrical path between a first component and a second component may be possible along any path that includes series of connecting components that are capable of being electrically conductive.

An integrated device (e.g., 103) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 103, 105) may include at least one electronic circuit (e.g., first electronic circuit, second electronic circuit, etc. . . . ). An integrated device may include transistors. An integrated device may be an example of an electrical component and/or electrical device. In some implementations, an integrated device may be a chiplet. In some implementations, an optical integrated device (e.g., 101) may be a chiplet. A chiplet may be fabricated using a process that provides better yields compared to other processes used to fabricate other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). Thus, for example, a single integrated device may be split into several chiplets. As mentioned above, using several chiplets that perform several functions may reduce the overall cost of a package relative to using a single chip to perform all of the functions of a package. In some implementations, one or more of the chiplets and/or one or more of integrated devices (e.g., 103) described in the disclosure may be fabricated using the same technology node or two or more different technology nodes. For example, an integrated device may be fabricated using a first technology node, and a chiplet may be fabricated using a second technology node that is not as advanced as the first technology node. In such an example, the integrated device may include components (e.g., interconnects, transistors) that have a first minimum size, and the chiplet may include components (e.g., interconnects, transistors) that have a second minimum size, where the second minimum size is greater than the first minimum size. In some implementations, an integrated device and another integrated device of a package, may be fabricated using the same technology node or different technology nodes. In some implementations, a chiplet and another chiplet of a package, may be fabricated using the same technology node or different technology nodes.

A technology node may refer to a specific fabrication process and/or technology that is used to fabricate an integrated device and/or a chiplet. A technology node may specify the smallest possible size (e.g., minimum size) that can be fabricated (e.g., size of a transistor, width of trace, gap with between two transistors). Different technology nodes may have different yield loss. Different technology nodes may have different costs. Technology nodes that produce components (e.g., trace, transistors) with fine details are more expensive and may have higher yield loss, than a technology node that produces components (e.g., trace, transistors) with details that are less fine. Thus, more advanced technology nodes may be more expensive and may have higher yield loss, than less advanced technology nodes. When all of the functions of a package are implemented in single integrated devices, the same technology node is used to fabricate the entire integrated device, even if some of the functions of the integrated devices do not need to be fabricated using that particular technology node. Thus, the integrated device is locked into one technology node. To optimize the cost of a package, some of the functions can be implemented in different integrated devices and/or chiplets, where different integrated devices and/or chiplets may be fabricated using different technology nodes to reduce overall costs. For example, functions that require the use of the most advance technology node may be implemented in an integrated device, and functions that can be implemented using a less advanced technology node can be implemented in another integrated device and/or one or more chiplets. One example, would be an integrated device, fabricated using a first technology node (e.g., most advanced technology node), that is configured to provide compute applications, and at least one chiplet, that is fabricated using a second technology node, that is configured to provide other functionalities, where the second technology node is not as costly as the first technology node, and where the second technology node fabricates components with minimum sizes that are greater than the minimum sizes of components fabricated using the first technology node. Examples of compute applications may include high performance computing and/or high performance processing, which may be achieved by fabricating and packing in as many transistors as possible in an integrated device, which is why an integrated device that is configured for compute applications may be fabricated using the most advanced technology node available, while other chiplets may be fabricated using less advanced technology nodes, since those chiplets may not require as many transistors to be fabricated in the chiplets. Thus, the combination of using different technology nodes (which may have different associated yield loss) for different integrated devices and/or chiplets, can reduce the overall cost of a package, compared to using a single integrated device to perform all the functions of the package.

Another advantage of splitting the functions into several integrated devices and/or chiplets, is that it allows improvements in the performance of the package without having to redesign every single integrated device and/or chiplet. For example, if a configuration of a package uses a first integrated device and a first chiplet, it may be possible to improve the performance of the package by changing the design of the first integrated device, while keeping the design of the first chiplet the same. Thus, the first chiplet could be reused with the improved and/or different configured first integrated device. This saves cost by not having to redesign the first chiplet, when packages with improved integrated devices are fabricated.

Exemplary Sequence for Fabricating a Package Comprising an Optical Integrated Device In some implementations, fabricating a package includes several processes. FIGS. 17A-17E illustrate an exemplary sequence for providing or fabricating a package. In some implementations, the sequence of FIGS. 17A-17E may be used to provide or fabricate the package 300 of FIG. 3. However, the process of FIGS. 17A-17E may be used to fabricate any of the packages (e.g., 100, 200, 400, 500, 600, 1200, 1300, 1400, 1500, 1600) described in the disclosure.

It should be noted that the sequence of FIGS. 17A-17E may combine one or more stages in order to simplify and/or clarify the sequence for providing or fabricating a package. In some implementations, the order of the processes may be changed or modified. In some implementations, one or more of processes may be replaced or substituted without departing from the spirit of the disclosure.

Figure 17A:
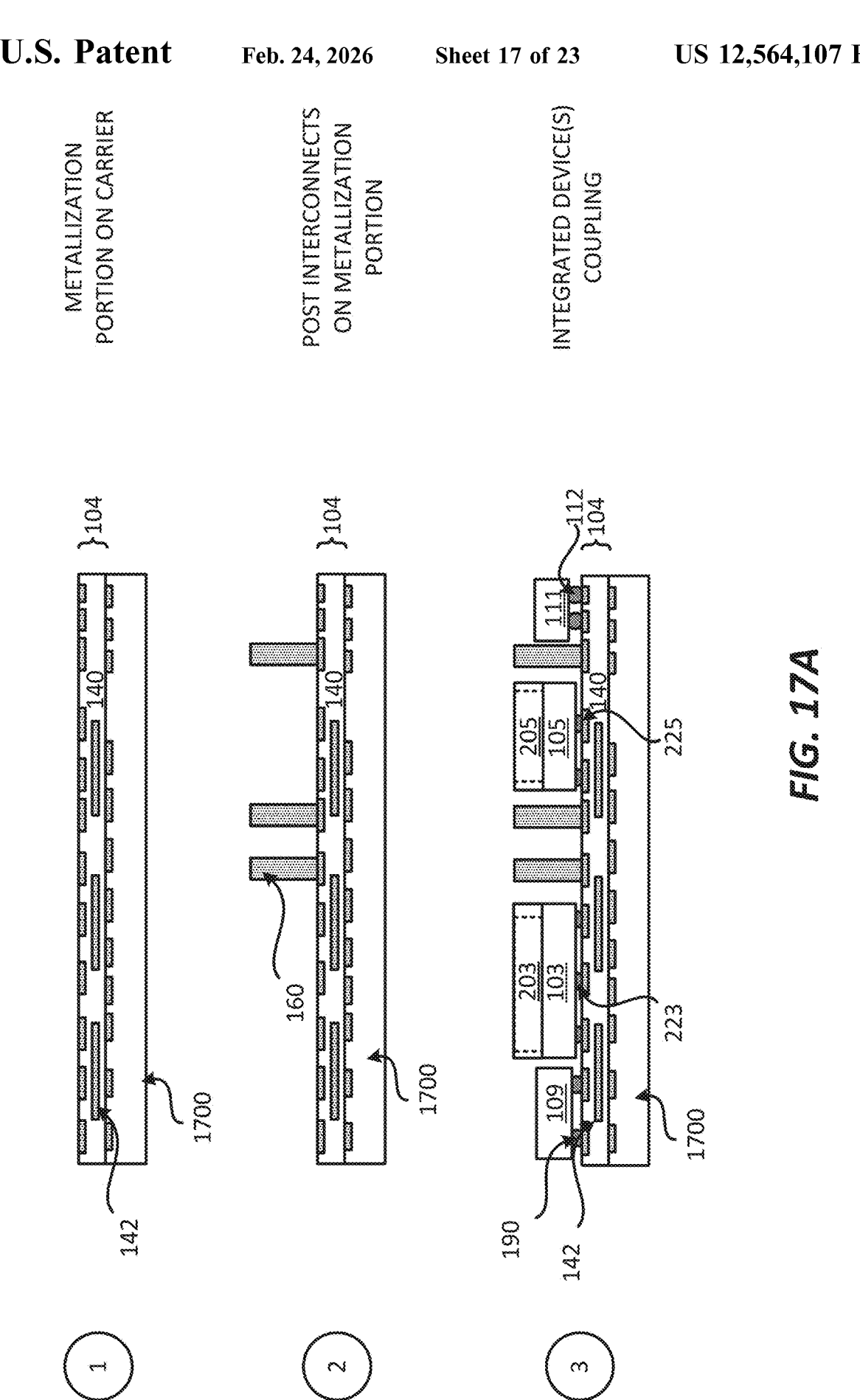
FIGS. 17A-17E illustrate an exemplary sequence for fabricating a package comprising an optical integrated device.

Stage 1, as shown in FIG. 17A, illustrates a state after a metallization portion 104 on a carrier 1700 is provided. The metallization portion 104 includes at least one dielectric layer 140 and a plurality of metallization interconnects 142. The metallization portion 104 may be formed on the carrier 1700. A deposition process, a masking process, an exposure process, an etching process, a plating process and/or a stripping process may be used to form the metallization portion 104. A deposition, a lamination, an exposure, a development and/or an etching process may be used to form and pattern the at least one dielectric layer. A plating process and/or a patterning process may be used to form the metallization interconnects.

Stage 2 illustrates a state after a plurality of post interconnects 160 is formed over and coupled to the metallization portion 104. The plurality of post interconnects 160 are coupled to the plurality of metallization interconnects 142. A plating process may be used to form the plurality of post interconnects 160.

Stage 3 illustrates a state after a plurality of integrated devices and/or at least one passive device that are coupled to a surface of the metallization portion 104. For example, the integrated device 103 is coupled to a surface of the metallization portion 104 through a plurality of solder interconnects 223. For example, the front side of the integrated device 103 is coupled to a surface of the metallization portion 104. The integrated device 103 may include the back side power rail interconnect 203. The integrated device 105 is coupled to a surface of the metallization portion 104 through a plurality of solder interconnects 225. For example, the front side of the integrated device 105 is coupled to a surface of the metallization portion 104. The integrated device 105 may include the back side power rail interconnect 205. The integrated device 109 is coupled to a surface of the metallization portion 104 through a plurality of solder interconnects 190. The passive device 111 is coupled to a surface of the metallization portion 104 through a plurality of solder interconnects 112. One or more solder reflow processes may be used to couple the plurality of integrated devices and/or the passive device to the metallization portion 104.

Figure 17B:
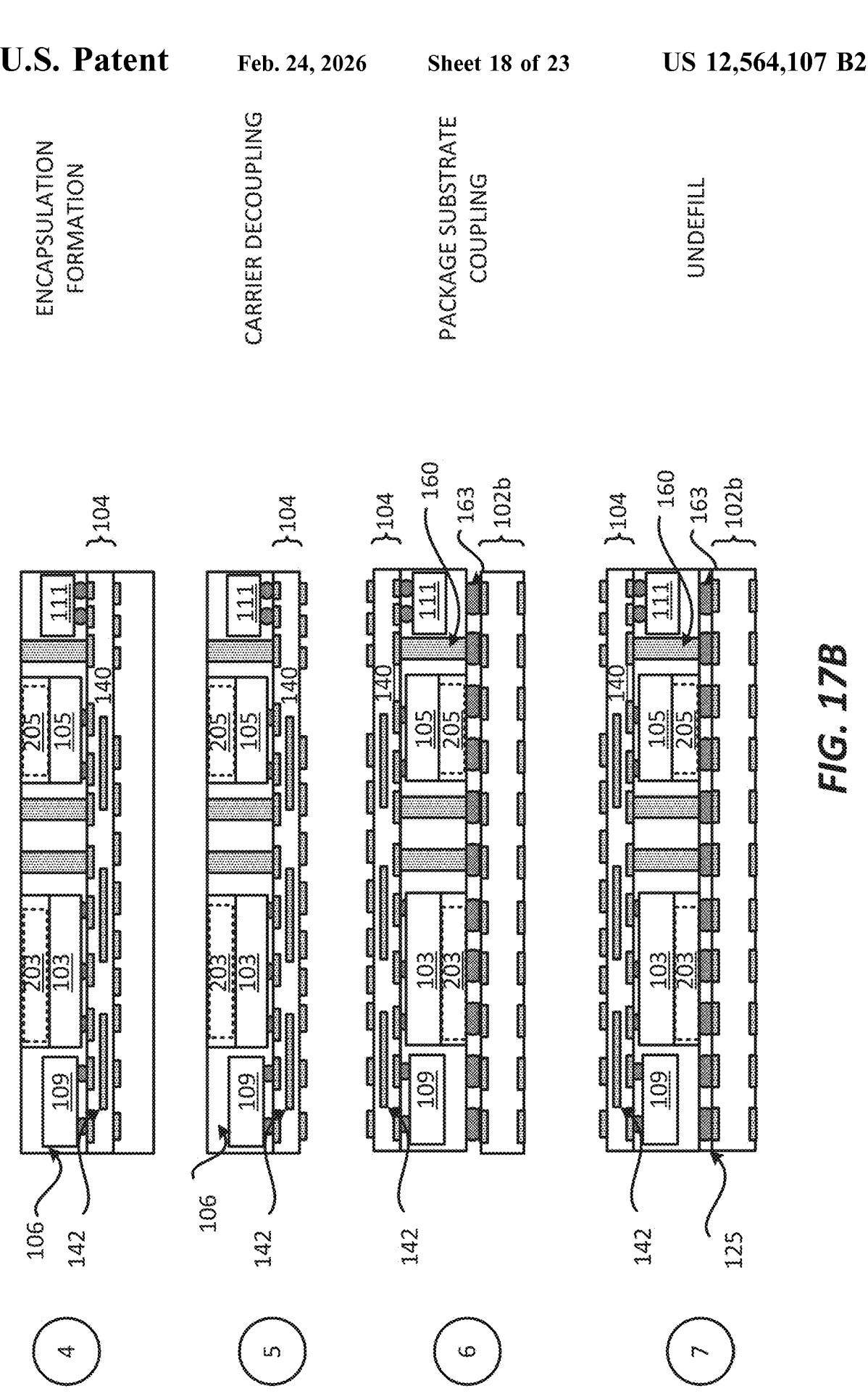

Stage 4, as shown in FIG. 17B, illustrates a state after an encapsulation layer 106 is formed over and coupled to the metallization portion 104. The encapsulation layer 106 may include a mold, a resin and/or an epoxy. A compression molding process, a transfer molding process, or a liquid molding process may be used to form the encapsulation layer 106. The encapsulation may encapsulate (e.g., partially encapsulate) the integrated device 103/back side power rail interconnect 203, the integrated device 105/back side power rail interconnect 205, the integrated device 109, the passive device 111 and the plurality of post interconnects 160.

Stage 5 illustrates a state after the carrier 1700 is decoupled from the metallization portion 104.

Stage 6 illustrates a state after a package substrate 102b is coupled to the back side power rail interconnects (e.g., 203, 205) of integrated devices (e.g., 103, 105), the plurality of post interconnects 160 through a plurality of solder interconnects 163. A solder reflow process may be used to couple the power rail interconnects and the plurality of post interconnects 160 through the plurality of solder interconnects 163. The package substrate 102b may be coupled to the back side of the integrated device 103 and the back side of the integrated device 105. The package substrate 102b includes at least one dielectric layer 120b and a plurality of interconnects 122b.

Stage 7 illustrates a state after an underfill 125 is provided between the package substrate 102b and the encapsulation layer 106. The underfill 125 may be formed such that the underfill 125 laterally surrounds the plurality of solder interconnects 123. The underfill 125 may be coupled to and touching the package substrate 102b, the plurality of solder interconnects 123, the encapsulation layer 106, the integrated device 103 and/or the integrated device 105.

Figure 17C:
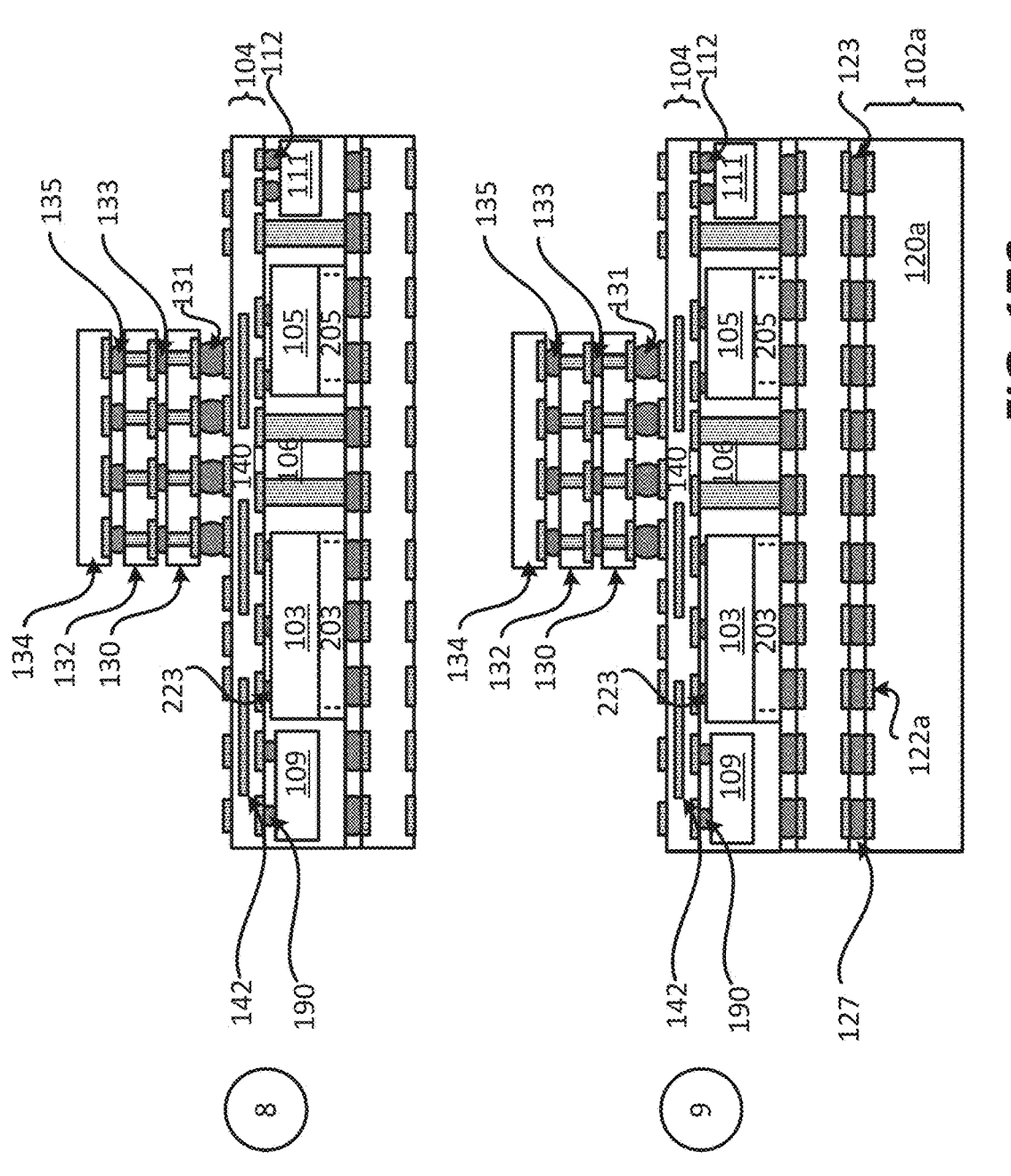

Stage 8, as shown in FIG. 17C, illustrates a state after one or more integrated devices are coupled to a surface of the metallization portion 104. For example, a stack of integrated device may be coupled to the metallization portion 104. In one example, a stack of integrated device comprising an integrated device 130, an integrated device 132 and an integrated device 134 may be coupled to the metallization portion 104 through a solder reflow process.

Stage 9 illustrates a state after the package substrate 102a is coupled to the package substrate 102b through a plurality of solder interconnects 123. A solder reflow process may be used to couple the package substrate 102a to the package substrate 102b. In some implementations, the package substrate 102a may include an optical integrated device 101 and/or an optical integrated device 101 may be coupled to the package substrate 102. As shown and described in FIGS. 1 and 2, in some implementations, an optical integrated device 101 may be part of the package substrate 102. The optical integrated device 101 may be located in a cavity of the package substrate 102a. The optical integrated device 101 may be coupled to the package substrate 102a through an adhesive.

Figure 17D:

Stage 10, as shown in FIG. 17D, illustrates a state after the package substrate 102a is coupled to a board 108 through a plurality of solder interconnects 183. A solder reflow process may be used to couple the package substrate 102 to the board 108.

Figure 17E:
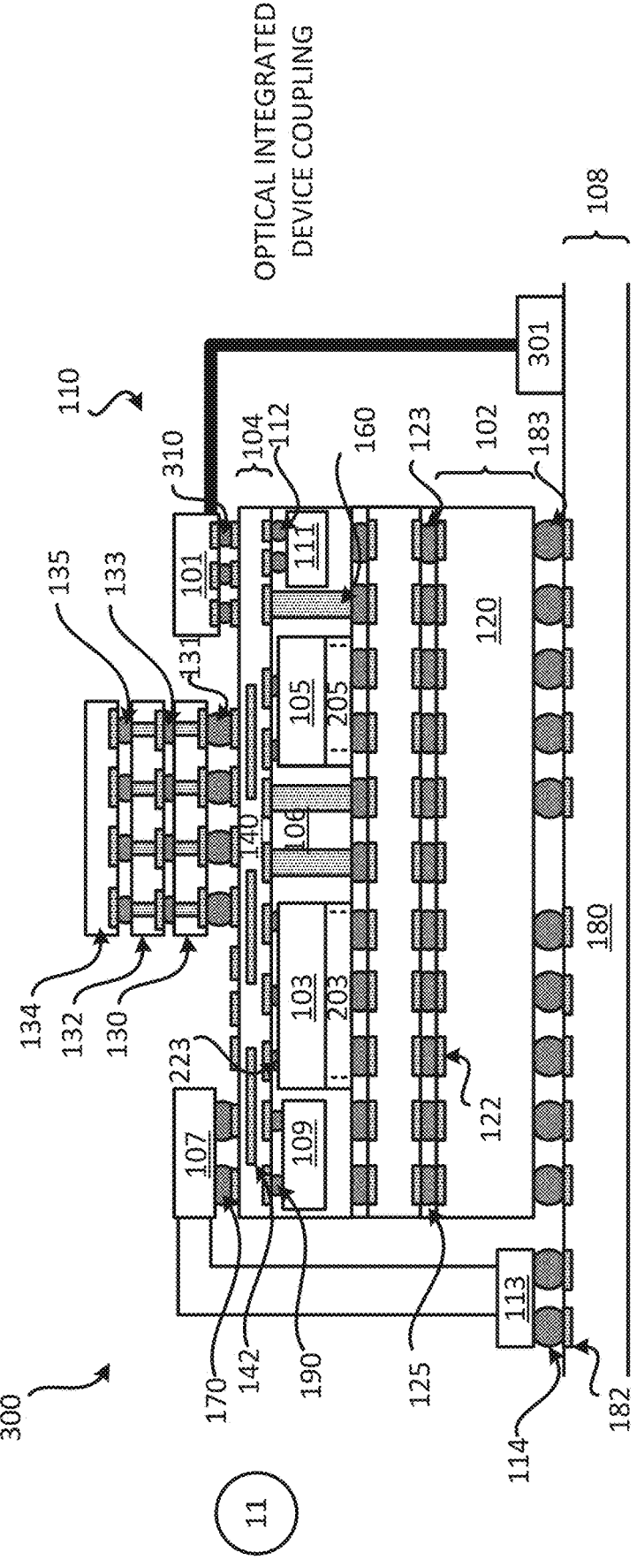

Stage 11, as shown in FIG. 17E, illustrates a state after the optical integrated device 101 is coupled to the metallization portion 104 through a plurality of solder interconnects 310. The optical integrated device 301 is coupled to the board 108. The optical integrated device 301 may be similar to the optical integrated device 101. The optical integrated device 301 may be coupled to the board 108 through a plurality of solder interconnects. An optical fiber 110 may be coupled to the optical integrated device 101 and the optical integrated device 301.

Stage 11 also illustrates a state after the connector socket 107 is coupled to the metallization portion 104 through a plurality of solder interconnects 170, and the connector socket 113 is coupled to the board 108 through a plurality of solder interconnects 114. A solder reflow process may be used to the connector socket 107 to the metallization portion 104, and the connector socket 113 to the board 108. The connector socket 107 may be coupled to the connector socket 113 through one or more wiring.

Exemplary Flow Diagram of a Method for Fabricating a Package Comprising an Optical Integrated Device In some implementations, fabricating a package includes several processes. FIG. 18 illustrates an exemplary flow diagram of a method 1800 for providing or fabricating a package. In some implementations, the method 1800 of FIG. 18 may be used to provide or fabricate the packages of at least FIGS. 1-6 and 9-16.

It should be noted that the method 1800 of FIG. 18 may combine one or more processes in order to simplify and/or clarify the method for providing or fabricating a package. In some implementations, the order of the processes may be changed or modified.

The method provides (at 1805) a metallization portion and a plurality of post interconnects. The metallization portion may be provided on a carrier. In some implementations, providing the metallization portion and the plurality of post interconnects includes fabricating the metallization portion and the plurality of post interconnects. Stages 1 and 2 of FIG. 17A, illustrate and describe an example of providing a metallization portion 104 and a plurality of post intercon-nects 160. The metallization portion 104 includes at least one dielectric layer 140 and a plurality of metallization interconnects 142. The metallization portion 104 may be formed on the carrier 1700. A deposition, a lamination, an exposure, a development and/or an etching process may be used to form and pattern the at least one dielectric layer. A plating process and/or a patterning process may be used to form the metallization interconnects.

Stage 2 of FIG. 17A illustrates and describes an example of a plurality of post interconnects 160 formed over and coupled to the metallization portion 104. The plurality of post interconnects 160 are coupled to the plurality of met-allization interconnects 142. A plating process may be used to form the plurality of post interconnects 160.

The method couples (at 1810) a plurality of integrated device(s) and/or at least on passive device to the metalliza-tion portion. Stage 3 of FIG. 17A illustrates and describes an example of a plurality of integrated devices and/or at least one passive device that are coupled to a surface of the metallization portion 104. For example, the integrated device 103 is coupled to a surface of the metallization portion 104 through a plurality of solder interconnects 223. The integrated device 105 is coupled to a surface of the metallization portion 104 through a plurality of solder interconnects 225. The integrated device 109 is coupled to a surface of the metallization portion 104 through a plurality of solder interconnects 190. The passive device 111 is coupled to a surface of the metallization portion 104 through a plurality of solder interconnects 112. One or more solder reflow processes may be used to couple the plurality of integrated devices and/or the passive device to the metalli-zation portion 104.

The method forms (at 1815) an encapsulation layer. The encapsulation layer may at least partially encapsulate the plurality of post interconnects, integrated devices and/or passive devices. Stage 4 of FIG. 17B illustrates and describes an example of an encapsulation layer 106 that is formed over and coupled to the metallization portion 104. The encapsulation layer 106 may include a mold, a resin and/or an epoxy. A compression molding process, a transfer molding process, or a liquid molding process may be used to form the encapsulation layer 106. The encapsulation may at least partially encapsulate the integrated device 103/back side power rail interconnect 203, the integrated device 105/back side power rail interconnect 205, the integrated device 109, the passive device 111 and the plurality of post interconnects 160.

The method may also remove (at 1815) a carrier that is coupled to the metallization portion. Stage 5 of FIG. 17B illustrates and describes an example of a carrier 1700 that is decoupled from the metallization portion 104.

The method may couple (at 1820) a package substrate to a plurality of post interconnects through a plurality of solder interconnects. Stage 6 of FIG. 17B illustrates and describes an example of a package substrate 102b that is coupled to the power rail interconnects (e.g., 203, 205) of integrated devices (e.g., 103, 105), the plurality of post interconnects 160 through a plurality of solder interconnects 163. A solder reflow process may be used to couple the power rail inter-connects and the plurality of post interconnects 160 through the plurality of solder interconnects 163. The package sub-strate 102b includes at least one dielectric layer 120b and a plurality of interconnects 122b.

The method may couple (at 1820) a package substrate to a plurality of post interconnects through a plurality of solder interconnects. Stage 6 of FIG. 17B illustrates and describes an example of a package substrate 102b that is coupled to the power rail interconnects (e.g., 203, 205) of integrated devices (e.g., 103, 105), the plurality of post interconnects 160 through a plurality of solder interconnects 163. A solder reflow process may be used to couple the power rail inter-connects and the plurality of post interconnects 160 through the plurality of solder interconnects 163. The package sub-strate 102b includes at least one dielectric layer 120b and a plurality of interconnects 122b.

In some implementations, once the package substrate 102b is coupled to the plurality of post interconnects through a plurality of solder interconnects, an underfill 125 may be provided between the package substrate 102 and the encap-sulation layer 106. The underfill 125 may be formed such that the underfill 125 laterally surrounds the plurality of solder interconnects 123. The underfill 125 may be coupled to and touching the package substrate 102, the plurality of solder interconnects 123, the encapsulation layer 106, the integrated device 103 and/or the integrated device 105.

The method may also couple (at 1820) integrated devices and/or passive devices to the package. For example, the method may couple the integrated devices and/or passive devices to a surface of the metallization portion. Stage 8 of FIG. 17C, illustrates and describes an example of one or more integrated devices that are coupled to a surface of the metallization portion 104. For example, a stack of integrated device may be coupled to the metallization portion 104. In one example, a stack of integrated device comprising an integrated device 130, an integrated device 132 and an integrated device 134 may be coupled to the metallization portion 104 through a solder reflow process.

The method may couple (at 1825) another package substrate to a package substrate through a plurality of solder interconnects. Stage 9 of FIG. 17C illustrates and describes an example of a package substrate 102*a* that is coupled to a package substrate 102*b* through a plurality of solder interconnects 123. A solder reflow process may be used to couple the package substrate 102*a* through the plurality of solder interconnects 123. The package substrate 102*a* includes at least one dielectric layer 120*a* and a plurality of interconnects 122*a*.

In some implementations, the package substrate 102*a* may include an optical integrated device 101 and/or an optical integrated device 101 may be coupled to the package substrate 102*a*. As shown and described in FIGS. 1 and 2, in some implementations, an optical integrated device 101 may be part of the package substrate 102. The optical integrated device 101 may be located in a cavity of the package substrate 102. The optical integrated device 101 may be coupled to the package substrate 102 through an adhesive.

The method may couple (at 1830) the package substrate to a board through a plurality of solder interconnects. Stage 10 of FIG. 17D illustrates and describes an example of a package substrate 102 that is coupled to a board 108 through a plurality of solder interconnects 183. A solder reflow process may be used to couple the package substrate 102 to the board 108.

The method may couple (at 1835) connector sockets to the package and the board. The method may also couple (at 1835) an optical integrated device to a package and another optical integrated device to a board. Stage 11 of FIG. 17E, illustrates and describes an example of the optical integrated device 101 that is coupled to the metallization portion 104 through a plurality of solder interconnects 310. The optical integrated device 301 is coupled to the board 108. The optical integrated device 301 may be similar to the optical integrated device 101. The optical integrated device 301 may be coupled to the board 108 through a plurality of solder interconnects. An optical fiber 110 may be coupled to the optical integrated device 101 and the optical integrated device 301.

Stage 11 of FIG. 17E also illustrates and describes an example of the connector socket 107 that is coupled to the metallization portion 104 through a plurality of solder interconnects 170, and the connector socket 113 is coupled to the board 108 through a plurality of solder interconnects 114. A solder reflow process may be used to the connector socket 107 to the metallization portion 104, and the connector socket 113 to the board 108. The connector socket 107 may be coupled to the connector socket 113 through one or more wiring.

Exemplary Electronic Devices

Figure 19:
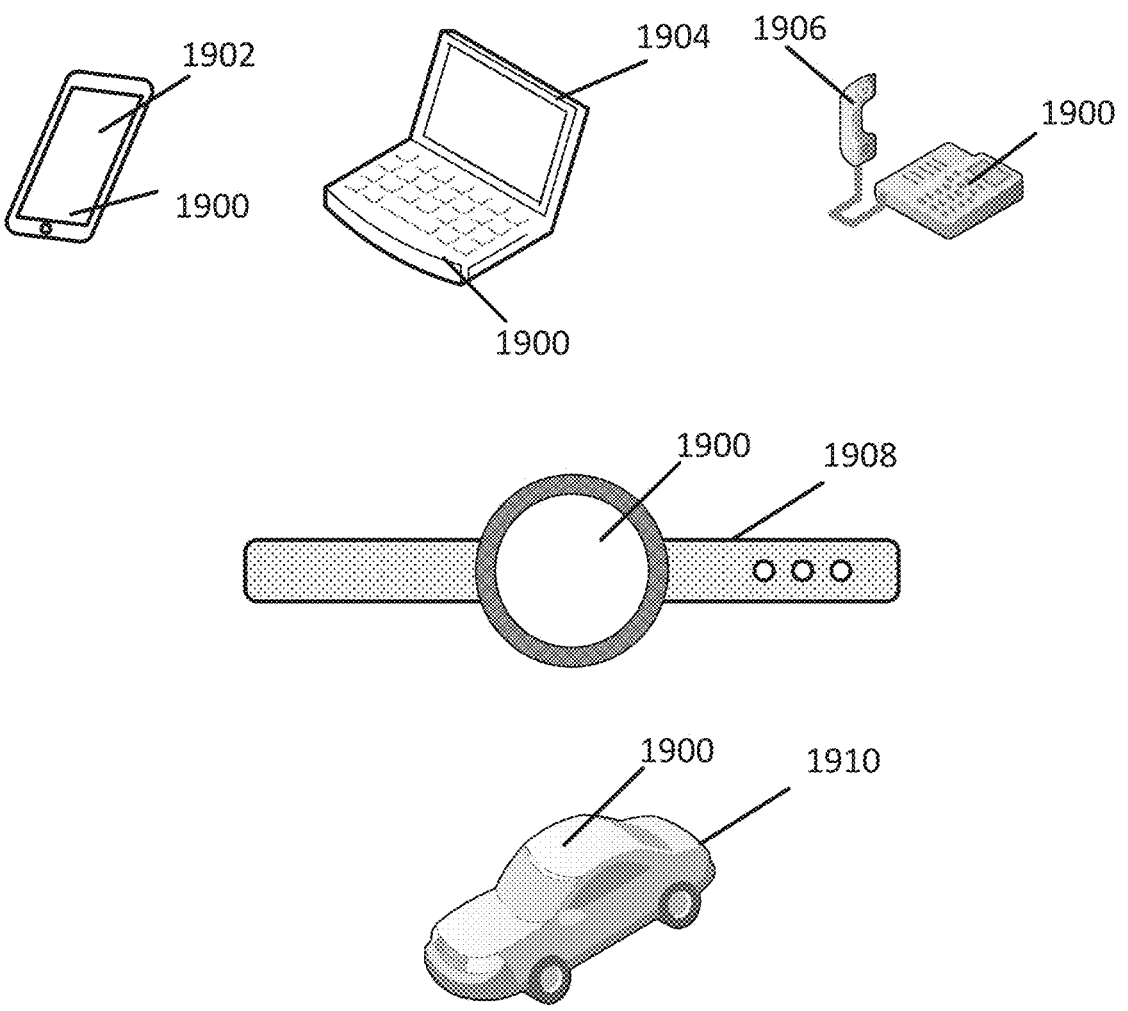
FIG. 19 illustrates various electronic devices that may integrate a die, an integrated device, an integrated passive device (IPD), a passive component, a package, and/or a device package described herein.

FIG. 19 illustrates various electronic devices that may be integrated with any of the aforementioned device, integrated device, integrated circuit (IC) package, integrated circuit (IC) device, semiconductor device, integrated circuit, die, interposer, package, package-on-package (POP), System in Package (SiP), or System on Chip (SoC). For example, a mobile phone device 1902, a laptop computer device 1904, a fixed location terminal device 1906, a wearable device 1908, or automotive vehicle 1910 may include a device 1900 as described herein. The device 1900 may be, for example, any of the devices and/or integrated circuit (IC) packages described herein. The devices 1902, 1904, 1906 and 1908 and the vehicle 1910 illustrated in FIG. 19 are merely exemplary. Other electronic devices may also feature the device 1900 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-16, 17A-17E and/or 18-19 may be rearranged and/or combined into a single component, process, feature or function or embodied in several components, processes, or functions. Additional elements, components, processes, and/or functions may also be added without departing from the disclosure. It should also be noted FIGS. 1-16, 17A-17E and/or 18-19 and its corresponding description in the present disclosure is not limited to dies and/or ICs. In some implementations, FIGS. 1-16, 17A-17E and/or 18-19 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (POP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. A first component that is "located" in a second component may mean that the first component is "partially located" in the second component or "completely located" in the second component. A first component that is "embedded" in a second component may mean that the first component is "partially embedded" in the second component or "completely embedded" in the second component. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1. A "plurality" of components may include all the possible components or only some of the components from all of the possible components. For example, if a device includes ten components, the use of the term "the plurality of components" may refer to all ten components or only some of the components from the ten components.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect is an electrically conductive material that may be configured to provide an electrical path for a current (e.g., a data signal, ground or power). An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or an electro plating process or electroless plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A package comprising a first package substrate; a second package substrate coupled to the first package substrate through a first plurality of solder interconnects; a first integrated device coupled to the second package substrate through a second plurality of solder interconnects; an encapsulation layer at least partially encapsulating the first integrated device; a plurality of post interconnects at least partially located in the encapsulation layer; a metallization portion coupled to the plurality of post interconnects; a second integrated device coupled to the metallization portion through a third plurality of solder interconnects; an optical integrated device coupled to the first package substrate; and an optical fiber coupled to the optical integrated device.

Aspect 2: The package of aspect 1, wherein a front side of the first integrated device faces the second package substrate.

Aspect 3: The package of aspects 1 through 2, further comprising a third integrated device coupled to the second package substrate through a fourth plurality of solder interconnects.

Aspect 4: The package of aspects 1 through 2, further comprising a third integrated device coupled to the first integrated device through a fourth plurality of solder interconnects.

Aspect 5: The package of aspects 1 through 2, further comprising a third integrated device coupled to the first integrated device.

Aspect 6: The package of aspects 1 through 5, wherein the second integrated device is configured to be electrically coupled to the first integrated device through an electrical path that includes a solder interconnect from the second plurality of solder interconnects, metallization interconnects from the metallization portion, a post interconnect from the plurality of post interconnects and a solder interconnect from the first plurality of solder interconnects, the optical integrated device, and another solder interconnect from the first plurality of solder interconnects.

Aspect 7: The package of aspects 1 through 6, further comprising a connector socket coupled to the metallization portion, wherein the connector socket is configured to provide an electrical path for power.

Aspect 8: The package of aspects 1 through 7, wherein the optical integrated device includes a waveguide and a circuit for processing optical signals and/or electrical signals.

Aspect 9: The package of aspects 1 through 8, wherein the optical fiber extends through the first package substrate.

Aspect 10: The package of aspects 1 through 9, wherein the second integrated device includes memory.

Aspect 11: A package comprising a first package substrate; an intermediate portion coupled to the first package substrate through a first plurality of solder interconnects, wherein the intermediate portion includes a first integrated device and a first encapsulation layer; a second integrated device coupled to the intermediate portion through a second plurality of solder interconnects; a second encapsulation layer at least partially encapsulating the first integrated device; a plurality of post interconnects at least partially located in the encapsulation layer; a metallization portion coupled to the plurality of post interconnects; a third integrated device coupled to the metallization portion through a third plurality of solder interconnects; an optical integrated device coupled to the first package substrate; and an optical fiber coupled to the optical integrated device.

Aspect 12: The package of aspect 11, wherein a front side of the second integrated device faces the intermediate portion.

Aspect 13: The package of aspects 11 through 12, further comprising a fourth integrated device coupled to the intermediate portion through a fourth plurality of solder interconnects.

Aspect 14: The package of aspects 11 through 12, further comprising a fourth integrated device coupled to the first integrated device through a fourth plurality of solder interconnects.

Aspect 15: The package of aspects 11 through 12, further comprising a fourth integrated device coupled to the first integrated device.

Aspect 16: The package of aspects 11 through 15, wherein the third integrated device is configured to be electrically coupled to the second integrated device through an electrical path that includes a solder interconnect from the second plurality of solder interconnects, metallization interconnects from the metallization portion, a post interconnect from the plurality of post interconnects and a solder interconnect from the first plurality of solder interconnects, the optical integrated device, and another solder interconnect from the first plurality of solder interconnects.

Aspect 17: The package of aspects 11 through 16, further comprising a connector socket coupled to the metallization portion, wherein the connector socket is configured to provide an electrical path for power.

Aspect 18: The package of aspects 11 through 17, wherein the optical integrated device includes a waveguide and a circuit for processing optical signals and/or electrical signals.

Aspect 19: The package of aspects 11 through 18, wherein the optical fiber extends through the first package substrate.

Aspect 20: The package of aspects 11 through 19, wherein the third integrated device includes memory.

Aspect 21: The package of aspects 11 through 20, wherein the package is implemented in a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 22: The package of aspects 1 through 10, wherein the package is implemented in a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 23: A device comprising a package of aspects 11 through 20, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 24: The device comprising a package of aspects 1 through 10, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the aspects. As such, the present teachings can be readily applied to other types of apparatuses and many alternatives, modifications, and variations will be apparent to those skilled in the art.

The invention claimed is:

1. A package comprising:
   a first package substrate;
   a second package substrate coupled to the first package substrate through a first plurality of solder interconnects;
   a first integrated device coupled to the second package substrate through a second plurality of solder interconnects;
   an encapsulation layer at least partially encapsulating the first integrated device;
   a plurality of post interconnects at least partially located in the encapsulation layer;
   a metallization portion coupled to the plurality of post interconnects;
   a second integrated device coupled to the metallization portion through a third plurality of solder interconnects;
   an optical integrated device located at least partially in the first package substrate; and
   an optical fiber coupled to the optical integrated device.

2. The package of claim 1, wherein a front side of the first integrated device faces in a direction of the second package substrate.

3. The package of claim 1, further comprising a third integrated device coupled to the second package substrate through a fourth plurality of solder interconnects.

4. The package of claim 1, further comprising a third integrated device coupled to the first integrated device through a fourth plurality of solder interconnects.

5. The package of claim 1, further comprising a third integrated device coupled to the first integrated device.

6. The package of claim 1, wherein the second integrated device is configured to be electrically coupled to the first integrated device through an electrical path that includes a solder interconnect from the second plurality of solder interconnects, metallization interconnects from the metallization portion, a post interconnect from the plurality of post interconnects and a solder interconnect from the first plurality of solder interconnects, the optical integrated device, and another solder interconnect from the first plurality of solder interconnects.

7. The package of claim 1, further comprising a connector socket coupled to the metallization portion, wherein the connector socket is configured to provide an electrical path for power.

8. The package of claim 1, wherein the optical integrated device includes a waveguide and a circuit for processing optical signals and/or electrical signals.

9. The package of claim 1, wherein the optical fiber extends through the first package substrate.

10. The package of claim 1, wherein the second integrated device includes memory.

11. A package comprising:

a first package substrate;

an intermediate portion coupled to the first package substrate through a first plurality of solder interconnects, wherein the intermediate portion includes a first integrated device and a first encapsulation layer;

a second integrated device coupled to the intermediate portion through a second plurality of solder interconnects;

a second encapsulation layer at least partially encapsulating the first integrated device;

a plurality of post interconnects at least partially located in the encapsulation layer;

a metallization portion coupled to the plurality of post interconnects;

a third integrated device coupled to the metallization portion through a third plurality of solder interconnects;

an optical integrated device located at least partially in the first package substrate; and an optical fiber coupled to the optical integrated device.

12. The package of claim 11, wherein a front side of the second integrated device faces in a direction of the intermediate portion.

13. The package of claim 11, further comprising a fourth integrated device coupled to the intermediate portion through a fourth plurality of solder interconnects.

14. The package of claim 11, further comprising a fourth integrated device coupled to the first integrated device through a fourth plurality of solder interconnects.

15. The package of claim 11, further comprising a fourth integrated device coupled to the first integrated device.

16. The package of claim 11, wherein the third integrated device is configured to be electrically coupled to the second integrated device through an electrical path that includes a solder interconnect from the second plurality of solder interconnects, metallization interconnects from the metallization portion, a post interconnect from the plurality of post interconnects and a solder interconnect from the first plurality of solder interconnects, the optical integrated device, and another solder interconnect from the first plurality of solder interconnects.

17. The package of claim 11, further comprising a connector socket coupled to the metallization portion, wherein the connector socket is configured to provide an electrical path for power.

18. The package of claim 11, wherein the optical integrated device includes a waveguide and a circuit for processing optical signals and/or electrical signals.

19. The package of claim 11, wherein the optical fiber extends through the first package substrate.

20. The package of claim 11, wherein the third integrated device includes memory.

* * * * *